US008576927B2

(12) United States Patent
Harada et al.

(10) Patent No.: US 8,576,927 B2
(45) Date of Patent: Nov. 5, 2013

(54) ENCODING METHOD, ENCODING DEVICE, DECODING METHOD, DECODING DEVICE, PROGRAM, AND RECORDING MEDIUM

(75) Inventors: Noboru Harada, Kanagawa (JP); Yutaka Kamamoto, Kanagawa (JP); Takehiro Moriya, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 254 days.

(21) Appl. No.: 13/061,971

(22) PCT Filed: Oct. 7, 2009

(86) PCT No.: PCT/JP2009/067482
§ 371 (c)(1),
(2), (4) Date: Mar. 3, 2011

(87) PCT Pub. No.: WO2010/041680
PCT Pub. Date: Apr. 15, 2010

(65) Prior Publication Data
US 2011/0158328 A1   Jun. 30, 2011

(30) Foreign Application Priority Data

Oct. 10, 2008   (JP) .................................. 2008-264075

(51) Int. Cl.
*H04B 14/04* (2006.01)
(52) U.S. Cl.
USPC ........... 375/242; 375/240.16; 341/50; 341/58
(58) Field of Classification Search
None
See application file for complete search history.

(56) References Cited

U.S. PATENT DOCUMENTS

| | | | |
|---|---|---|---|
| 6,255,967 B1* | 7/2001 | Norrell et al. | 341/58 |
| 2003/0026335 A1 | 2/2003 | Thyagarajan | |
| 2003/0161404 A1* | 8/2003 | Wu | 375/240.16 |
| 2004/0044527 A1 | 3/2004 | Thumpudi et al. | |
| 2004/0184545 A1 | 9/2004 | Thyagarajan | |
| 2005/0015249 A1 | 1/2005 | Mehrotra et al. | |
| 2006/0132334 A1* | 6/2006 | Malvar | 341/50 |
| 2006/0171465 A1 | 8/2006 | Thyagarajan | |
| 2008/0021704 A1 | 1/2008 | Thumpudi et al. | |
| 2008/0228476 A1 | 9/2008 | Mehrotra et al. | |
| 2008/0262855 A1 | 10/2008 | Mehrotra et al. | |

FOREIGN PATENT DOCUMENTS

| | | |
|---|---|---|
| JP | 8 289304 | 11/1996 |
| JP | 2004 258603 | 9/2004 |
| JP | 2004 531995 | 10/2004 |

OTHER PUBLICATIONS

International Search Report issued Dec. 1, 2009 in PCT/JP09/067482 filed Oct. 7, 2009.

(Continued)

*Primary Examiner* — Leon-Viet Nguyen
(74) *Attorney, Agent, or Firm* — Oblon, Spivak, McClelland, Maier & Neustadt, L.L.P.

(57) ABSTRACT

A frame formed of a plurality of code words encoded with an encoding mode in which two different types of code words are assigned one-to-one to two smallest quantization intervals is checked to determine whether it contains just the two types of code words assigned to the two smallest quantization intervals, and lossless encoding is applied to the frame containing just the two types of code words. A code obtained by this lossless encoding is decoded with a decoding method corresponding to the lossless encoding.

18 Claims, 15 Drawing Sheets

(56) References Cited

OTHER PUBLICATIONS

Hori, Yutaka et al., "Linear Predictive Analysis for Lossless Coding of Logarithmic Companded Signal", The Acoustical Society of Japan, pp. 379-380, (Mar. 2008), (with full English translation).

Takezawa, Tetsuya et al., "A Lossless Compression Method of Time-Series Data Based on Increasing Average of Neighboring Signals", The Institute of Electrical Engineers of Japan, vol. 128, No. 2, pp. 318-325, (Feb. 2008).

ITU-T Recommendation G.711, "Pulse Code Modulation (PCM) of Voice Frequencies", ITU-T, pp. 1-10, (1993).

"Information technology—Coding of audio-visual objects—Part 3: Audio," ISO/IEC 14496-3, Amendment 2: Audio Lossless Coding (ALS), New Audio Profiles and BSAC Extensions, pp. 1-83, (2005).

ITU-T Recommendation G.701, "Vocabulary of Digital Transmission and Multiplexing, and Pulse Code Modulation (PCM) Terms", General Aspects of Digital Transmission Systems, ITU-T, pp. 1-37, (Mar. 1993).

Salomon, David:, "Data Compression: The Complete Reference," $3^{rd}$ Edition, Springer-Verleg, ISBN-10: 0-387-40697-2, p. 57-73, (2004).

Ghido, Florin et al., "Accounting for Companding Nonlinearities in Lossless Audio Compression", Proc. ICASSP, vol. 1, pp. 1-261-1-264, (2007).

Chinese Office Action issued Feb. 29, 2012, in Chinese Patent Application No. 200980138615.8 (with English-language translation).

\* cited by examiner

FIG.4

| V | 1-98 | 99-120 | 121-131 | 132-137 | 138-141 | 142-143 | 144-145 |
|---|---|---|---|---|---|---|---|
| m | 1 | 2 | 3 | 4 | 5 | 6 | 7 |
| m' | | 2 | 3 | 4 | 5 | 6 | 7 |

| V | 146-147 | 148 | 149 | 150 | 151 | 152 | 153 |
|---|---|---|---|---|---|---|---|
| m | 8 | 9 | 10 | 11 | 12 | 14 | 15 |
| m' | 8 | 9 | 10 | 11 | 12 | 14 | 15 |

| V | 154 | 155 | 156 | 157 | 158 | 159 | 160 |
|---|---|---|---|---|---|---|---|
| m | 18 | 22 | 27 | 37 | 55 | 111 | |
| m' | 18 | | 27 | | 55 | | |

FIG.5

| CODE | v | m' | c |
|---|---|---|---|
| 0000 | v < 121 | 2 | 1 |
| 0001 | v < 132 | 3 | 2 |
| 0010 | v < 138 | 4 | 2 |
| 0011 | v < 142 | 5 | 3 |
| 0100 | v < 144 | 6 | 3 |
| 0101 | v < 146 | 7 | 3 |
| 0110 | v < 148 | 8 | 3 |
| 0111 | v < 149 | 9 | 4 |
| 1000 | v < 150 | 10 | 4 |
| 1001 | v < 151 | 11 | 4 |
| 1010 | v < 152 | 12 | 4 |
| 1011 | v < 153 | 14 | 4 |
| 1100 | v < 154 | 15 | 4 |
| 1101 | v < 156 | 18 | 5 |
| 1110 | v < 158 | 27 | 5 |
| 1111 | v < 160 | 55 | 6 |

ENCODING METHOD, ENCODING DEVICE, DECODING METHOD, DECODING DEVICE, PROGRAM, AND RECORDING MEDIUM

TECHNICAL FIELD

The present invention relates to a signal encoding technology, and more specifically, to a technology for lossless encoding of an encoded signal.

BACKGROUND ART

ITU-T (International Telecommunication Union Telecommunication Standardization Sector) G. 711 (Non-patent literature 1) is an international standard of voice-frequency signal encoding. ITU-T G. 711 uses non-uniform pulse code modulation (PCM) as the encoding mode and prescribes two types of non-linear quantization modes, μ law and A law. Hereafter, a voice-frequency signal is referred to as a voice signal.

MPEG-4 established by the ISO/IEC JTC 1/SC 29/WG 11 is an international standard for video and audio encoding, and its third part stipulates an audio lossless encoding technology and the like (Non-patent literature 2).

PRIOR ART LITERATURE

Non-Patent Literature

Non-patent literature 1: ITU-T Recommendation G. 711, "Pulse Code Modulation (PCM) of voice frequencies," ITU-T, 1993

Non-patent literature 2: ISO/IEC 14496-3 AMENDMENT 2: Audio Lossless Coding (ALS), new audio profiles and BSAC Extensions, 2005

SUMMARY OF THE INVENTION

Problems to be Solved by the Invention

Terms used in this specification are based on ITU-T G. 701 (Reference literature 1) unless otherwise stated. This, however, does not mean that the range of application of the present invention is limited to the field of application of the ITU-T G recommendations. If the present invention is applied to a different field, such as the field related to Non-patent literature 2, the terms used here should be read as any corresponding terms in that field.
Reference literature 1: ITU-T Recommendation G 701, "Vocabulary of Digital Transmission and Multiplexing, and Pulse Code Modulation (PCM) Terms," ITU-T, 1993.

If the currently widespread general subscriber phones were replaced by Voice Over Internet Protocol (VoIP) systems, the transmission capacity requirement for voice transmission would increase. The transmission capacity requirement of a single transmission line conforming to ITU-T G. 711 described in the Non-patent literature 1 is 64 Kbits per second multiplied by 2, for example. As the number of transmission lines increases, the transmission capacity required for voice transmission increases in proportion. Accordingly, to decrease the transmission capacity requirement while maintaining the sound quality as high as possible, a compression coding technology for performing lossless encoding of signals encoded with non-uniform PCM is necessary.

Voice signals may sometimes include a non-active speech period in time. In applications such as telephony, non-active speech periods appear often. In the non-active speech period, however, there is some background noise. Therefore, the signal amplitude in the non-active speech period is not always zero and is often within ranges corresponding to quantized values closest to signal amplitude of zero. The ranges corresponding to quantized values are referred to as quantization intervals. That is, the ranges quantized to corresponding quantized values are referred to as the quantization intervals corresponding to the quantized values. The quantization interval closest to the quantization value of signal amplitude of zero is hereafter referred to as the smallest quantization interval. In other words, the smallest quantization interval means the quantization interval corresponding to the quantized value closest to signal amplitude of zero. In the example of G. 711, which uses non-uniform PCM, each of eight-bit code words is assigned to each quantization interval. The eight-bit code words correspond to the descriptions in the sixth columns in TABLE 2a/G. 711 (μ-law, positive input values), TABLE 2b/G. 711 (μ-law, negative input values), TABLE 2a/G. 711 (A-law, positive input values), and TABLE 2b/G. 711 (A-law, negative input values) in Non-patent literature 1, for example. In the μ law, the sign indicating whether the signal amplitude is positive or negative is considered, and there are two smallest quantization intervals adjacent to a decision value of signal amplitude of zero. The two smallest quantization intervals can also be regarded as adjacent quantization intervals having different polarity bits. These two smallest quantization intervals correspond to the smallest quantization interval having positive signal amplitude and the smallest quantization interval having negative signal amplitude, respectively, and their corresponding quantization values are signal amplitude of zero. Different code words are defined one-to-one for the two smallest quantization intervals. More specifically, each unique code word is defined for each of the two smallest quantization intervals: An eight-bit code word "11111111" is assigned to the positive smallest quantization interval; and an eight-bit code word "01111111" is assigned to the negative smallest quantization interval (see sixth columns in TABLE 2a/G. 711 (μ-law, positive input values), and TABLE 2b/G. 711 (μ-law, negative input values) in Non-patent literature 1, for example). Hereafter, the eight-bit code word "11111111" is written as "+0", and the eight-bit code word "01111111" is written as "−0". In the A law, the sign indicating whether the signal amplitude is positive or negative is considered, and there are two smallest quantization intervals, for which different code words are defined one-to-one. In the A law, an eight-bit code word "10000000" is assigned to the positive smallest quantization interval, and an eight-bit code word "00000000" is assigned to the negative smallest quantization interval (see sixth columns in TABLE 2a/G. 711 (A-law, positive input values) and TABLE 2b/G. 711 (A-law, negative input values) in Non-patent literature 1, for example). In that case, the eight-bit code word "10000000" is written as "+1", and the eight-bit code word "00000000" is written as "−1". In some actual applications, even-numbered positions of the code words "10000000" and "00000000" in Non-patent literature 1 are inverted, and code words "11010101" and "01010101" may be assigned (see Note 2 in TABLE 2a/G. 711 (A-law, positive input values) and TABLE 2b/G. 711 (A-law, negative input values) in Non-patent literature 1, for example). In that case, the eight-bit code word "11010101" is written as "+8", and the eight-bit code word "01010101" is written as "−8". In the A law, the quantized values corresponding to these code words are "+1" and "−1" in thirteen-bit signed integer representation. In actual applications, since the input PCM signal in sixteen-bit signed integer representation usually must be encoded without overflow, the A-law encoding is performed without using three low-order bits of the input PCM signal in sixteen-bit signed integer representation. In decimal representation, the input PCM signal divided by eight is encoded with the A law encoding. Therefore, the A-law quantized values "+1" and "−1" correspond to the input PCM signals "+8" and "−8" in sixteen-bit signed integer representation.

One possible compression coding method for the encoded signals in the non-active speech period is a method described in Non-patent literature 2 to reduce the amount of data. When a single type of code word or a single types of value is assigned to each of all samples in a single frame containing a plurality of samples, the frame is expressed by a predetermined code to reduce the amount of code.

In the signals encoded with general PCM, the compression performance can be improved by giving special handling to a signal amplitude value which occurs with a high probability statistically in some special cases such as the non-active speech period. On the other hand, the method disclosed in Non-patent literature 2 alone cannot provide a sufficient compression effect when the μ-law or A-law non-uniform PCM is used. This is because two types of code words "+0" and "−0" or "+8" and "−8" occur with high probabilities statistically during silence since the code words "+0" and "−0" or "+8" and "−8" are assigned to the smallest quantization intervals.

In view of the description given above, an object of the present invention is to provide a technology for lossless encoding of signals encoded with an encoding mode in which different code words are assigned one-to-one to two smallest quantization intervals.

Means to Solve the Problems

According to the present invention, code words encoded with an encoding mode in which two different code words are assigned one-to-one to two smallest quantization intervals are input; it is judged whether a frame formed of a plurality of code words contains just the two different code words assigned to the two smallest quantization intervals; and lossless encoding of the frame containing just the two different code words is performed. For that type of frame, at least, reversible compression of the input code words is possible. The code obtained by the lossless encoding is decoded by a decoding method corresponding to the lossless encoding.

Effects of the Invention

According to the present invention, efficient lossless encoding of signals encoded with an encoding mode in which different code words are assigned one-to-one to two smallest quantization intervals is possible.

BRIEF DESCRIPTION OF THE DRAWINGS

FIG. 4 is a table showing the relationship among the sum v of the numbers of contiguous code words, the Golomb parameter m, and the reduced Golomb parameter m' when the number of samples in a single frame is 160;

FIG. 5 is a table listing the sum v of the numbers of contiguous code words, the reduced Golomb parameter m', and the value c, represented by a four-bit code, based on the relationship shown in FIG. 4;

DETAILED DESCRIPTION OF THE EMBODIMENTS

<Example Hardware Configuration of Encoder>

Figure 1:
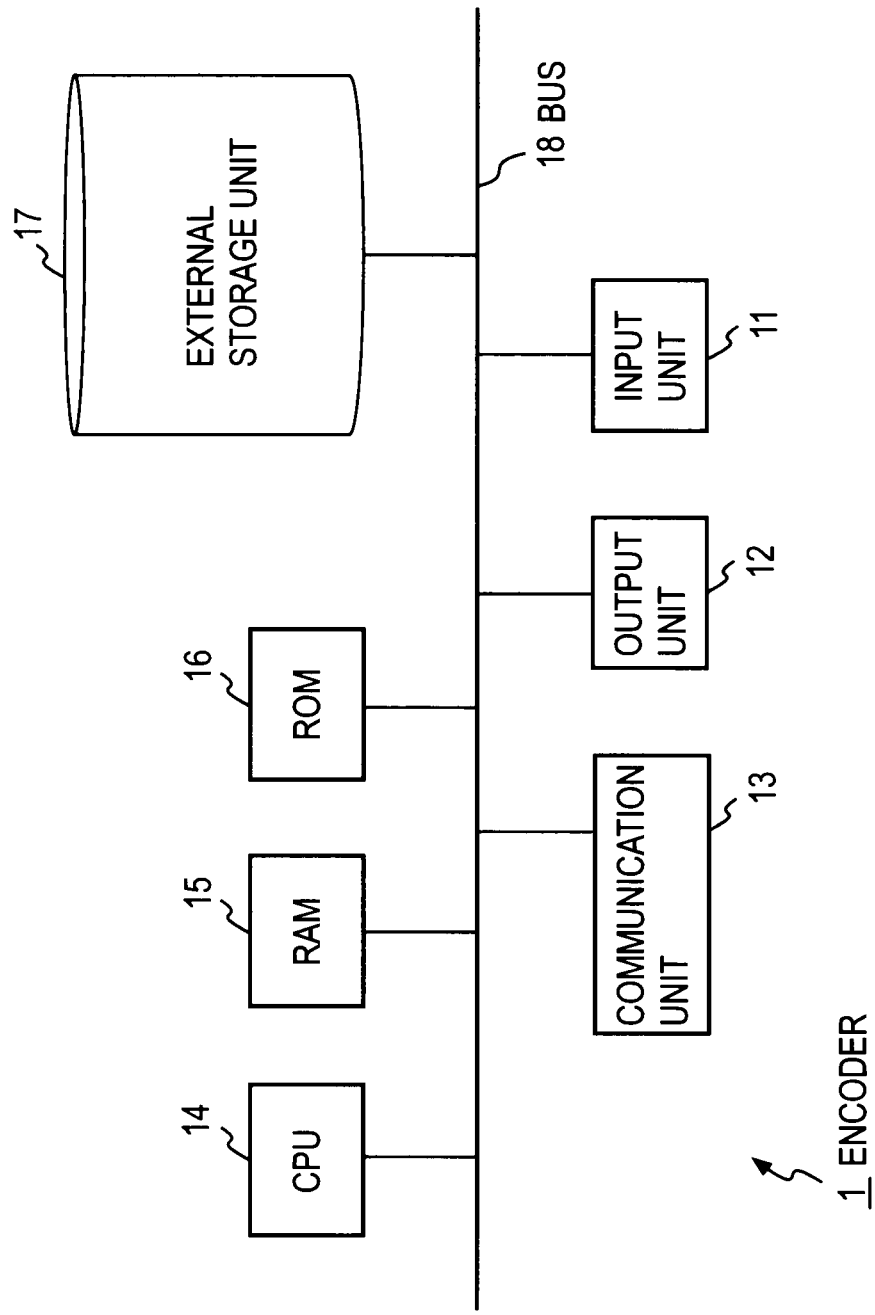
FIG. 1 is a view showing an example hardware configuration of an encoder according to an embodiment.
Figure 2:
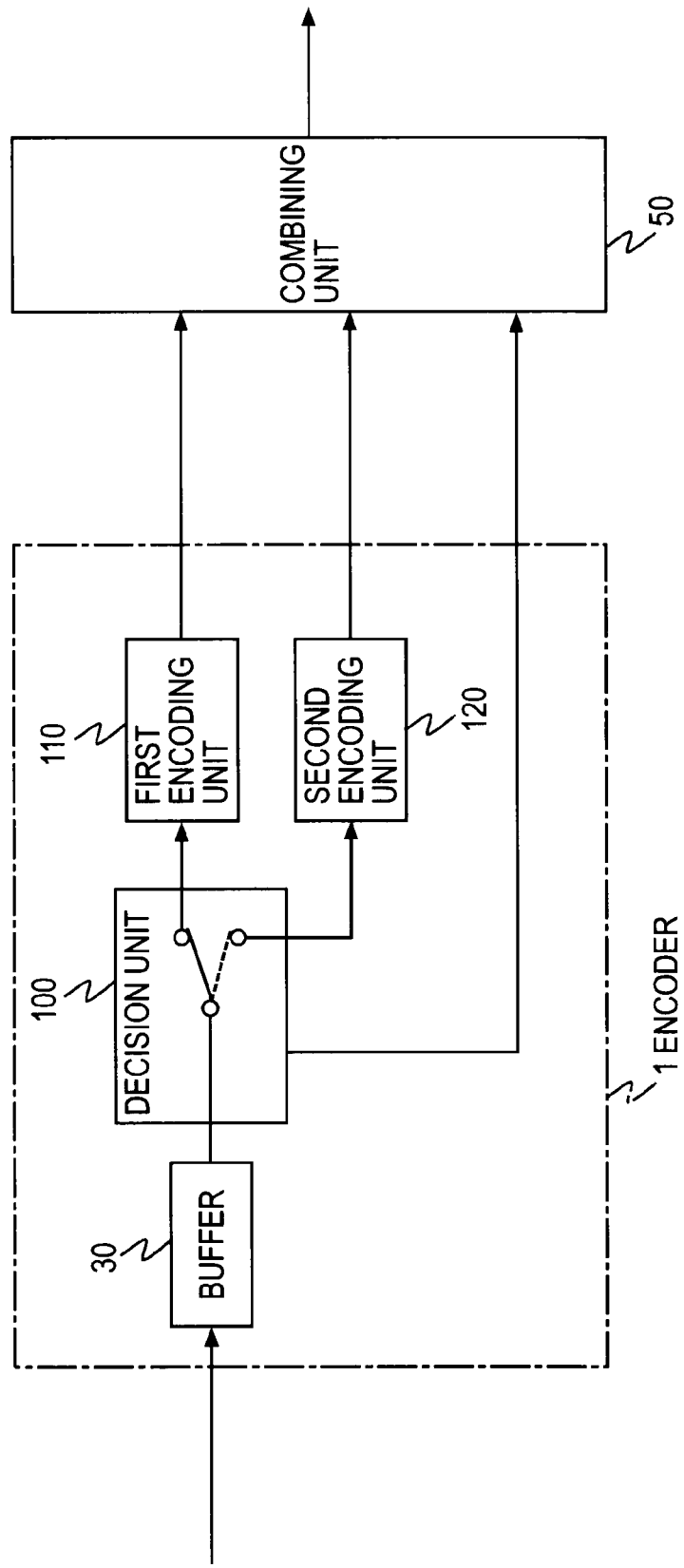
FIG. 2 is a block diagram showing an example functional configuration of the encoder according to the embodiment.
Figure 3:
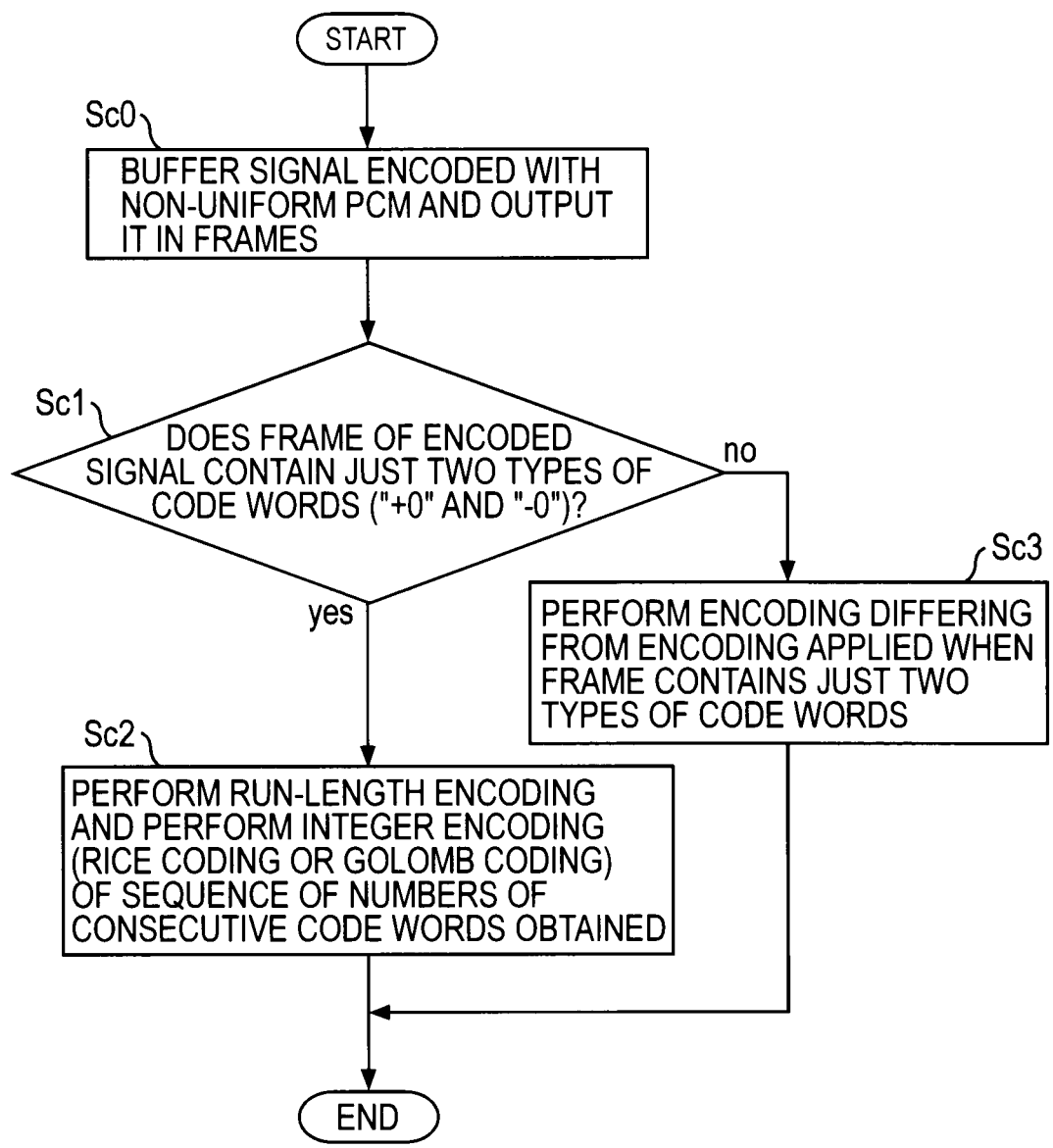
FIG. 3 is a view showing a processing flow of encoding in the embodiment.

FIG. 1 is a configuration block diagram showing an example hardware configuration of an encoder 1. As shown in FIG. 1, the encoder 1 includes an input unit 11 to which a keyboard or the like can be connected; an output unit 12 to which a liquid crystal display unit or the like can be connected; a communication unit 13 to which a communication device (such as a communication cable) that enables external communication with the encoder 1 can be connected; a central processing unit (CPU) 14 (the CPU may include a cache memory or a register); memories, which are a RAM 15 and a ROM 16; an external storage unit 17, which is a hard disk drive; and a bus 18 that is connected to allow data exchange among the input unit 11, the output unit 12, the communication unit 13, the CPU 14, the RAM 15, the ROM 16, and the external storage unit 17. The encoder 1 may include a drive for reading and writing storage media, such as a CD-ROM, when necessary. Physical entities having these hardware resources include a general-purpose computer.

The external storage unit of the encoder 1 stores a program for encoding, data needed in the processing of the program, and others (storage is not limited to the external storage unit, and the program may be stored, for example, in a read-only memory, or a ROM). Data (such as compression-coded signals) obtained by executing the program is stored in the RAM, the external storage unit, or the like, if necessary. The storage units that store programs, data, the addresses of their storage locations, and the like are hereafter collectively called a memory part.

The signals handled in each embodiment are signals obtained by encoding voice signals with a certain encoding mode. The encoding mode has two smallest quantization intervals and different code words (character signals) are assigned one-to-one to the intervals. An example of the encoding mode is non-uniform PCM. In ITU-T G. 711, for example, since non-uniform PCM is adopted as the encoding mode, encoded signals means signals encoded with non-uniform PCM. In that case, the non-linear quantization mode may be either the μ law or the A law. To make the following description clear, in what follows, the encoding mode and the non-linear quantization mode are assumed to be non-uniform PCM and the μ law, respectively.

The memory part of the encoder 1 stores a program for judging whether a frame contains just two types of code words, a program for performing first lossless encoding in which run-length encoding of the frame containing just two types of code words is followed by an integer encoding of a sequence of the numbers of contiguous code words obtained by the run-length encoding, and a program for performing second lossless encoding differing from the first lossless encoding is performed.

In the encoder 1, each program stored in the memory part and data needed for executing the program are read into the RAM when needed, and the CPU interprets and executes the program to process the data. When the CPU fulfills given functions (a decision unit, a first encoding unit, and a second encoding unit), desired encoding is implemented.

<Encoding>

The flow of encoding in the encoder 1 will be described next with reference to FIGS. 2 to 9.

[Step Sc0]

A buffer 30 in the encoder 1 buffers the signals encoded with non-uniform PCM and outputs the signals encoded with non-uniform PCM in units of frames. In other words, the buffer 30 outputs frames each formed of a plurality of code words encoded with non-uniform PCM.

[Step Sc1]

A decision unit 100 in the encoder 1 judges whether each frame of the signals encoded with non-uniform PCM contains just two types of code words "+0" and "−0". In other words, the decision unit 100 judges whether a frame formed of a plurality of code words encoded with non-uniform PCM contains just two types of code words "+0" and "−0". This means that the decision unit 100 judges whether all the code words included in the frame are not same and whether each code word is either "+0" or "−0".

If the frame includes just two types of code words "+0" and "−0", the decision unit 100 sends the frame to a first encoding unit 110, otherwise the decision unit 100 sends the frame to a second encoding unit 120. The decision unit 100 outputs an encoding designation code representing the type of encoding. If the frame is sent to the first encoding unit 110, the decision unit 100 outputs a code indicating that first coding has been selected. If the frame is sent to the second encoding unit 120, the decision unit 100 outputs a code indicating that second coding has been selected.

[Step Sc2]

The first encoding unit 110 of the encoder 1 performs lossless encoding of the frame of the signals encoded with non-uniform PCM, as described below, and outputs the code obtained by that lossless encoding. The frame includes just two types of code words, "+0" and "−0".

The first encoding unit 110 first performs run-length encoding of the code words included in the frame. Run-length encoding is one method of lossless encoding. In run-length encoding, the code word "+0" can be adopted as a criterion for encoding, for example. In that case, if the frame includes a sequence of these code words, +0, +0, +0, +0, +0, −0, the number of contiguous code words is 5. Alternatively, the code word "−0" can also be adopted as a criterion for encoding. In that case, if the frame includes a sequence of these code words, −0, −0, −0, −0, +0, the number of contiguous code words is 4.

In this embodiment, a predetermined encoding criterion can be applied to all the frames input to the first encoding unit 110. However, the operation is not limited to this. It is preferred that the first encoding unit 110 selectively adopt either criterion in each frame, in accordance with the ratio of the code words included in the frame, and perform run-length encoding while applying the criterion to the frame. Usually, either code word of the two that occurs more frequently in the frame is adopted as the criterion. When the two types of code words are referred to as a first code word and a second code word, when the total number of first code words included in the frame is greater than the total number of second code words, the first code word becomes the criterion for encoding. When the total number of second code words is greater than the total number of first code words, the second code word becomes the criterion code word.

The first encoding unit 110 detects, according to the criterion of run-length encoding from the beginning of the frame, the number of times the criterion code word appears consecutively (the number of contiguous code words) and obtains a sequence of the numbers of contiguous code words. If the frame begins with a code word that is not used as the criterion, the first encoding unit 110 maintains the number of contiguous code words at zero until the criterion code word appears. For example, when the code word "+0" is used as the criterion, and the frame begins with a sequence of code words −0, −0, −0, −0, +0, +0, −0, . . . , the sequence of the numbers of contiguous code words becomes 0, 0, 0, 0, 2, . . . . The first encoding unit 110 assumes that the last code word in the frame is followed by the code word that is not adopted as the criterion. For example, if the code word "+0" is used as the criterion and if the frame ends with a sequence of code words . . . , −0, +0, +0, the last code word "+0" is assumed to be followed by a code word "−0", and the corresponding number of contiguous code words becomes 2. If the code word that is not used as the criterion appears consecutively in the frame, the corresponding number of contiguous criterion code words is 0. If the criterion code word appears just once before the code word that is not used as the criterion appears, the corresponding number of contiguous criterion code words is 1. If the code word "+0" is used as the criterion and if a sequence of code words . . . , −0, +0, −0, −0, −0, . . . appears, the sequence of the numbers of contiguous criterion code words becomes . . . , 1, 0, 0, . . . .

The first encoding unit 110 performs an integer encoding of the sequence of the numbers of contiguous code words obtained in run-length encoding. The integer encoding here means unary encoding, Golomb coding, Rice coding, or the like. It is preferred that the integer encoding be lossless encoding. An example using Rice coding or Golomb coding, which is variable-length encoding, will be described here.

An example of encoding a sequence of the numbers of contiguous code words with Rice coding will be described next.

An example of voice signals of forty samples per frame encoded with non-uniform PCM will be described. Suppose that a given frame includes a sequence of these code words: +0, −0, +0, +0, +0, +0, −0, +0, +0, +0, +0, −0, +0, +0, +0, −0, +0, +0, +0, +0, −0, +0, +0, +0, +0, +0, +0, +0, +0, +0, +0, −0, +0, +0, +0, +0, +0, +0. Since a single sample is assigned an eight-bit code word (refer to Non-patent literature 1), the amount of data for the frame is calculated as follows: 8 bits×40 samples=320 bits (40 bytes).

If run-length encoding is performed by using the code word "+0" as the criterion and if the sequence of the numbers of contiguous code words is encoded with Rice coding, the amount of data becomes as indicated below.

Run-length encoding of the example given above with the code word "+0" used as the criterion provides this sequence of the numbers of contiguous code words: 1, 4, 4, 3, 4, 12, 6. Rice coding of this sequence of the numbers of contiguous code words provides a sequence of code words (Rice code) as given below, for example, where S is a Rice parameter:
S=1: 11 0010 0010 011 0010 00000010 00010 (30 bits)
S=2: 101 0100 0100 111 0100 000100 0110 (28 bits)
S=3: 1001 1100 1100 1011 1100 01100 1110 (29 bits)

In the examples given above, the codes corresponding to the quotients and remainders obtained in Rice coding of the numbers of contiguous code words are connected in that order and used as a code word. The code word can be obtained by connecting the remainders and quotients in that order. In that case, the sequence of code words (Rice code) obtained in Rice coding of the sequence of the numbers of contiguous code words is as follows:
S=1: 11 0001 0001 101 0001 00000001 00001 (30 bits)
S=2: 011 0001 0001 111 0001 000001 1001 (28 bits)
S=3: 0011 1001 1001 0111 1001 10001 1101 (29 bits)

Since the code of the quotient can be obtained by unary encoding, the 0s and 1s of code representing the quotient can be inverted. In that case, the sequence of code words (Rice code) obtained in Rice coding of the sequence of the numbers of contiguous code words is as follows:
S=1: 10 01100110110 0110 0111111001110 (30 bits)
S=2: 010 0010 0010 110 0010 001110 1010 (28 bits)
S=3: 0010 1000 1000 0110 1000 10010 1100 (29 bits)

The Rice code of the sequence of the numbers of contiguous code words may also be obtained in Rice coding disclosed in Non-patent literature 2.

Generally, the amount of data for the sequence of obtained code words (Rice code) depends on the Rice parameter S, so the sequence of code words with the minimum amount of data should be selected as the Rice code of the sequence of the numbers of contiguous code words obtained with run-length coding. The sequence of code words is the code output by the first encoding unit 110.

When the number of samples included in a frame is n, the Rice parameter S is an integer satisfying 1≤S≤R, where R is the minimum integer that satisfies n<$2^R$. For example, when a single frame includes 40 samples, as in the example described above, the minimum integer R that satisfies 40<$2^R$ is 6, so S=1, 2, 3, 4, 5, or 6. The Rice code need not be obtained for all the integers satisfying 1≤S≤R; it may be obtained for only some of the integers.

If the Rice parameter S is 0, it is equivalent to encoding each code word included in the frame to a single bit, with the code word "+0" replaced with a binary "0" and the code word "−0" replaced with a binary "1", for example. In other words, the first encoding unit 110 can adopt an encoding mode by which the two types of code words of non-uniform PCM are expressed to be distinguished by a single bit. If the code word "+0" is expressed as a binary "0" and the code word "−0" is expressed as a binary "1", for example, the sequence of code words of a given frame encoded with non-uniform PCM as described above is 0100001000010001000010000000000001000000. The amount of data for this sequence of code words is 40 bits (5 bytes).

In the examples described above, the amount of data for the code output by the first encoding unit 110 with any coding mode is about 40 bits at most, which is sufficiently compressed in comparison with 320 bits, the amount of data for the code words obtained with non-uniform PCM.

As indicated by the description given above, the sequence of code words (Rice code) obtained in Rice coding of the sequence of the numbers of contiguous code words is not a unique one. Therefore, the specific encoding method used in encoding must be known in decoding. Accordingly, a specific encoding method should be determined beforehand. Alternatively, a code specifying the encoding method used by the encoder (encoder 1) should be sent to the decoder (decoder 2, which will be described later). The amount of data for the code will be described in addition.

If the value of the Rice parameter S is 1, 2, 3, 4, 5, or 6 in the example described above, a code of three bits is enough for expressing the Rice parameter S. A code of a single bit can sufficiently express which is the criterion of run-length encoding. If binary encoding, which encodes the two types of code words of non-uniform PCM to expressions that can be distinguished by a single bit, is permitted, a code of two bits can sufficiently express the encoding method, as described later. The first encoding unit 110 outputs these codes together with the Rice code.

Examples of codes expressing an encoding method
(1) 0: Binary encoding, which encodes the two types of code words of non-uniform PCM to expressions that are distinguished by a single bit
(2) 10: Run-length encoding using the code word "+0" as the criterion
(3) 11: Run-length encoding using the code word "−0" as the criterion Consequently, Rice coding of the sequence of the numbers of contiguous code words obtained with run-length encoding may require the sum of the amount of data for the Rice code, the amount of data for the code expressing the Rice parameter S, the amount of data for the code expressing the criterion for run-length encoding and the code expressing encoding by which the two types of code words of non-uniform PCM are distinguished by a single bit, the amount of data for the code identifying the details of Rice coding, and others. Even in that case, several tens of bits are enough for the example described above, which is sufficiently smaller than 320 bits, which is the amount of data for the code words obtained with non-uniform PCM.

An example of encoding a sequence of the numbers of contiguous code words with Golomb coding will be described next.

An example of encoding of voice signals having forty samples per frame with non-uniform PCM will be described. Suppose that a given frame includes a sequence of these code words: +0, −0, +0, +0, +0, +0, −0, +0, +0, +0, +0, −0, +0, +0, +0, −0, +0, +0, +0, +0, −0, +0, +0, +0, +0, +0, +0, +0, +0, +0, +0, +0, +0, −0, +0, +0, +0, +0, +0, +0. If run-length encoding is performed by using the code word "+0" as the criterion, the sequence of the numbers of contiguous code words obtained in this example is 1, 4, 4, 3, 4, 12, 6.

Supposing that the sum of the numbers of contiguous code words is v and the number of samples included in the frame is n, the Golomb parameters m and c are obtained as given by Equations (1) and (2) below. The symbol ⌈·⌉ represents a ceiling function. The condition v≤n is always satisfied.

$$m = \left\lceil -\frac{\log_2(1 + v/n)}{\log_2(v/n)} \right\rceil \quad (1)$$

$$c = \lceil \log_2 m \rceil \quad (2)$$

When the values of the numbers of contiguous code words appearing in the sequence of the numbers of contiguous code words (values 1, 4, 4, 3, 4, 12, and 6 in the example given above) are expressed as t, the Golomb code of t is obtained by performing unary coding of the quotient q obtained by Equation (3), performing binary coding of the remainder r obtained by Equation (4), the binary coding of c−1 bits of r being performed if r is a value within the range of 0 to $2^c-m-1$, or the binary coding of c bits of $r+2^c-m$ being performed if r is greater than or equal to $2^c-m$, and joining the unary code of the quotient q and the binary code of the remainder r. If c is a power of 2, r should be coded by binary coding of c bits, which corresponds to Rice coding. The symbol $\lfloor . \rfloor$ represents a floor function.

$$q = \left\lfloor \frac{t}{m} \right\rfloor \quad (3)$$

$$r = t - qm \quad (4)$$

By expressing the values of the numbers of contiguous code words appearing in the sequence of the numbers of contiguous code words one after another by Golomb code, a sequence of code words (Golomb code) obtained by Golomb coding of the sequence of the numbers of contiguous code words obtained with run-length encoding is obtained. This sequence of code words is output by the first encoding unit 110. As in Rice coding, the first encoding unit 110 outputs also the code expressing the Golomb parameter, the code expressing the criterion for run-length encoding and the code expressing encoding by which the two types of code words of non-uniform PCM are distinguished by a single bit, and the code identifying the details of Golomb coding, if necessary.

The Rice coding and Golomb coding are described in detail in Reference literature 2.
Reference literature 2: David Salomon, "Data Compression: The Complete Reference," 3rd edition, Springer-Verlag, ISBN-10: 0-387-40697-2, 2004.

In Golomb coding, the Golomb parameter m must also be given to the decoder (decoder 2, which will be described later). As clearly indicated by Equation (1), as the sum v of the numbers of contiguous code words increases, the value of the Golomb parameter m increases whereby the amount of data for the binary code expressing m increases. Accordingly, a reduction of the Golomb parameter m should be considered. This will be described with reference to FIG. 4.

FIG. 4 shows the relationship among the sum v of the numbers of contiguous code words, the Golomb parameter m, and the reduced Golomb parameter m' when the number of samples (frame length) in a single frame is 160. Here, m indicates the value of the Golomb parameter corresponding to the sum v of all the numbers of contiguous code words that can appear within the range of the samples in the single frame (1≤v≤159 in this example). The reduced Golomb parameter m' has such a compressed value that the amount of data for the reduced Golomb parameter m' selected in this frame does not exceed a predetermined amount of data in transmission. For example, the Golomb parameter m' can have sixteen values. If the maximum amount of data that can be used in the communication channel to transmit the Golomb parameter selected in the frame to the decoder is set to four bits (16 ways), the reduced Golomb parameter m' is the result of compression of the Golomb parameter m obtained by Equation (1) to four bits (16 ways). Some ways of compressing the Golomb parameter m can be considered, and FIG. 4 shows an example of non-linear compression in which the compression ratio increases as the original Golomb parameter m increases. More specifically, the minimum value of the Golomb parameter m corresponding to the values of v in a predetermined range is given as the reduced Golomb parameter m' corresponding to the range v. FIG. 5 shows the relationship based on FIG. 4 between each four-bit code, and the sum v of the numbers of contiguous code words, the reduced Golomb parameter m', and c.

[Step Sc3]

The second encoding unit 120 of the encoder 1 performs lossless encoding of a frame of the signals encoded with non-uniform PCM, in a different way from the encoding by the first encoding unit 110. This frame is a frame other than the frame containing just two types of code words, "+0" and "−0".

As long as encoding by the second encoding unit 120 differs from encoding by the first encoding unit 110, no special limitations are applied. For example, no encoding (encoding in the widest sense) is permitted. In other words, the second encoding unit 120 may output the signals encoded with non-uniform PCM as it is. This means that the first encoding unit 110 performs lossless compression coding of just the frames corresponding to each non-active speech period of the signals encoded with non-uniform PCM.

The second encoding unit 120 can also perform linear prediction encoding of the frame of the signals encoded with non-uniform PCM.

It is known that the compression ratio obtained by converting the signals encoded with logarithmic companding (logarithmic companding codes) to uniform PCM codes, performing linear prediction encoding of the uniform PCM codes, converting the predicted values calculated by using the obtained prediction coefficients to logarithmic companding codes, and encoding the respective residuals between the original logarithmic companding codes and the predicted logarithmic companding codes is higher than that obtained by performing the linear prediction encoding of the signals encoded with logarithmic companding such as μ-law or A-law (Reference literature 3).
Reference literature 3: Ghido, F. & Tabus, I., "Accounting for companding nonlinearities in lossless audio compression," Proc. ICASSP, Vol. 1, pp. 261-264, 2007.

Figure 6:
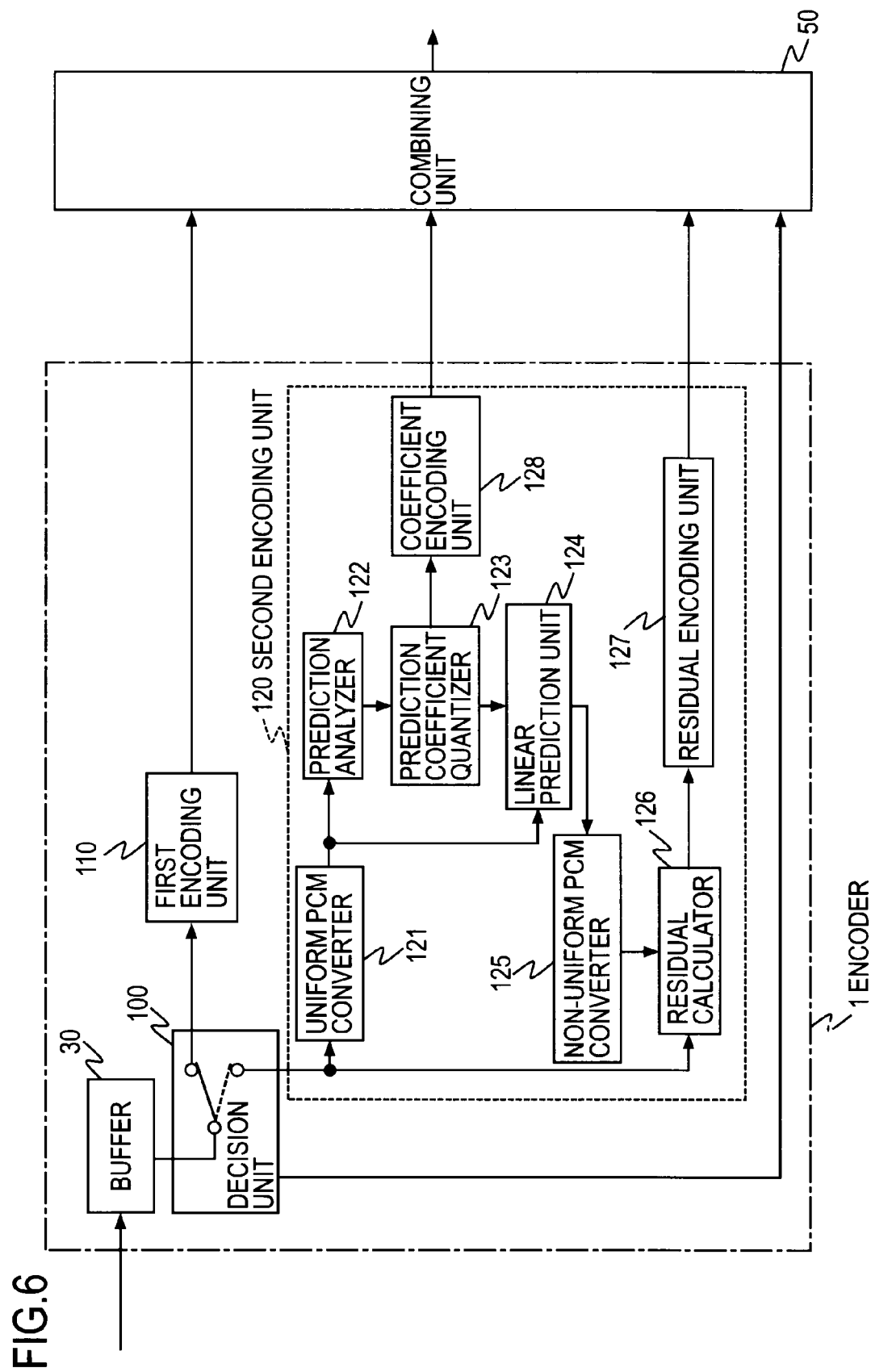
FIG. 6 is a block diagram showing an example functional configuration of a second encoding unit, in the example functional configuration of the encoder in the embodiment.

Accordingly, the second encoding unit 120 may perform linear prediction encoding in which the signals (non-uniform PCM codes) containing code words encoded with non-uniform PCM are converted to uniform PCM codes, linear prediction analysis of the uniform PCM codes are performed, predicted values calculated by using the obtained prediction coefficients are converted to non-uniform PCM codes, and the respective residuals between the original non-uniform PCM codes and the non-uniform PCM codes of the predicted values are encoded. A functional block diagram for that case is shown in FIG. 6.

A uniform PCM converter 121 converts signals formed of code words encoded with non-uniform PCM to uniform PCM codes. A prediction analyzer 122 obtains linear prediction coefficients by performing a prediction analysis of the obtained uniform PCM codes. A prediction coefficient quantizer 123 quantizes the linear prediction coefficients and outputs quantized prediction coefficients. A linear prediction unit 124 obtains prediction values from the quantized prediction coefficients and the uniform PCM codes. A non-uniform PCM converter 125 converts the prediction values to non-uniform PCM codes. A residual calculator 126 obtains the respective residuals between the original non-uniform PCM codes and the non-uniform PCM codes of the prediction values. A residual encoding unit 127 encodes the obtained residuals and outputs residual codes. A coefficient encoding unit 128 encodes the quantized prediction coefficients and outputs the result. The encoding method applied to the residuals and the encoding method applied to the quantized prediction coefficients are predetermined encoding methods.

Figure 7:
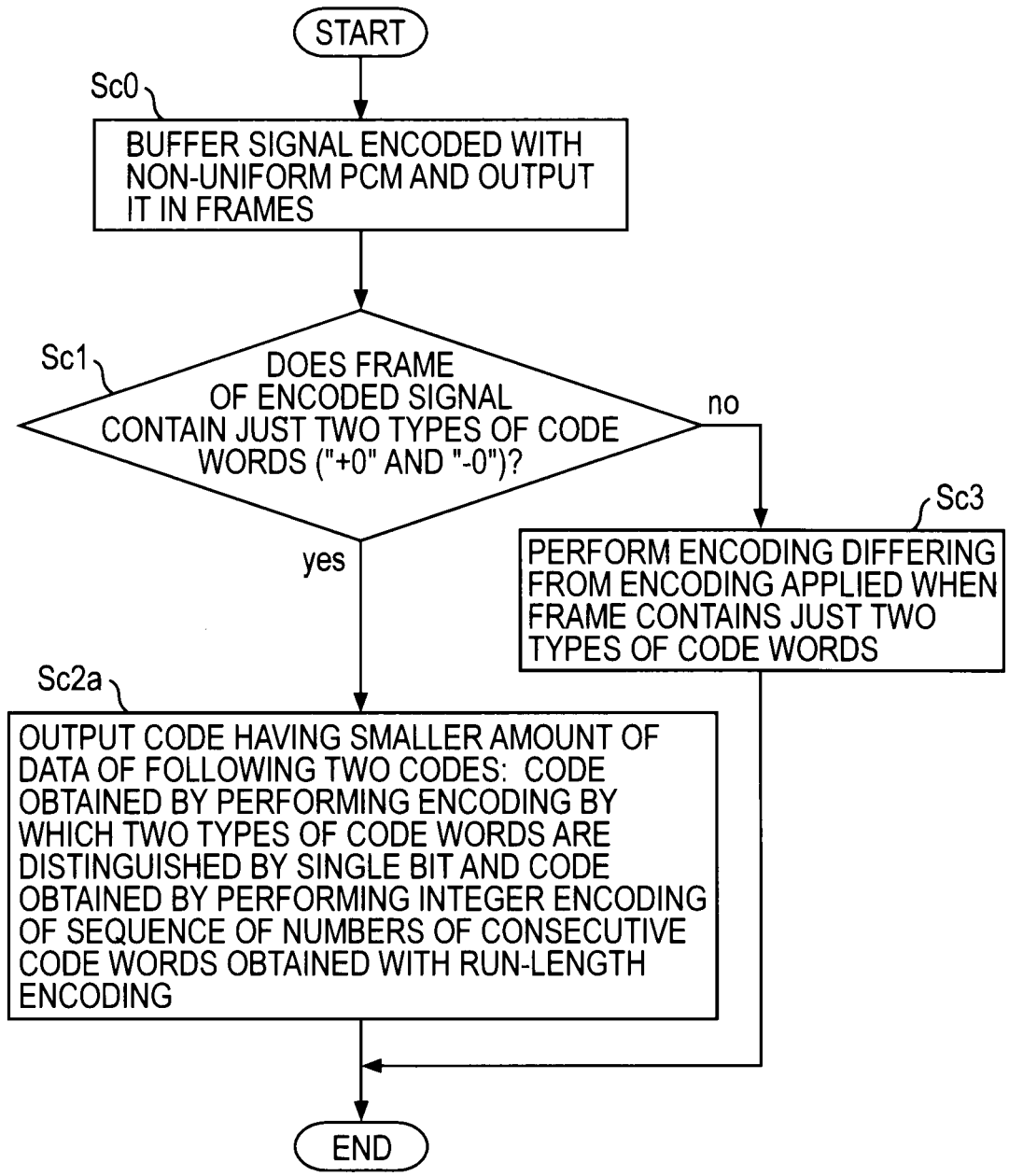
FIG. 7 is a view showing a processing flow of a modification of the encoding in the embodiment.

In a modification of the above-described embodiment, processing can be adopted as illustrated in FIG. 7.

Since Rice coding and Golomb coding are variable-length encoding, there is a possibility that, depending on the sequence of numbers of contiguous code words obtained with run-length encoding, the amount of data for the Rice code and Golomb code becomes greater than the amount of data for codes obtained by encoding that encodes the two types of codes of non-uniform PCM to expressions that can be distinguished by a single bit. The first encoding unit 110 outputs the code having a smaller amount data of the following two codes (step Sc2a in FIG. 7): the code obtained by encoding that encodes the two types of codes of non-uniform PCM to expressions that can be distinguished by a single bit, and the code obtained by an integer encoding (Rice coding, Golomb coding, etc.) of the sequence of the numbers of contiguous code words obtained with run-length encoding. The code obtained by a two-stage encoding method in which a sequence of the numbers of contiguous code words obtained with run-length encoding is subjected to an integer encoding is not limited to the code obtained by one type of two-stage encoding method and can be the code having the smallest amount of data for the codes obtained by executing different kinds of two-stage encoding. Examples of the different kinds of two-stage encoding described here are obtained by combining two-types of run-length encoding depending on the criterion code words and different kinds of an integer encoding such as Rice coding and Golomb coding. The first encoding unit 110 also outputs a code indicating the encoding method corresponding to the output code, that is, the code indicating the method of encoding that encodes the two types of code words of non-uniform PCM to expressions that can be distinguished by a single bit or the code indicating the encoding method of performing an integer encoding of a sequence of the numbers of contiguous code words obtained with run-length encoding.

Figure 8:
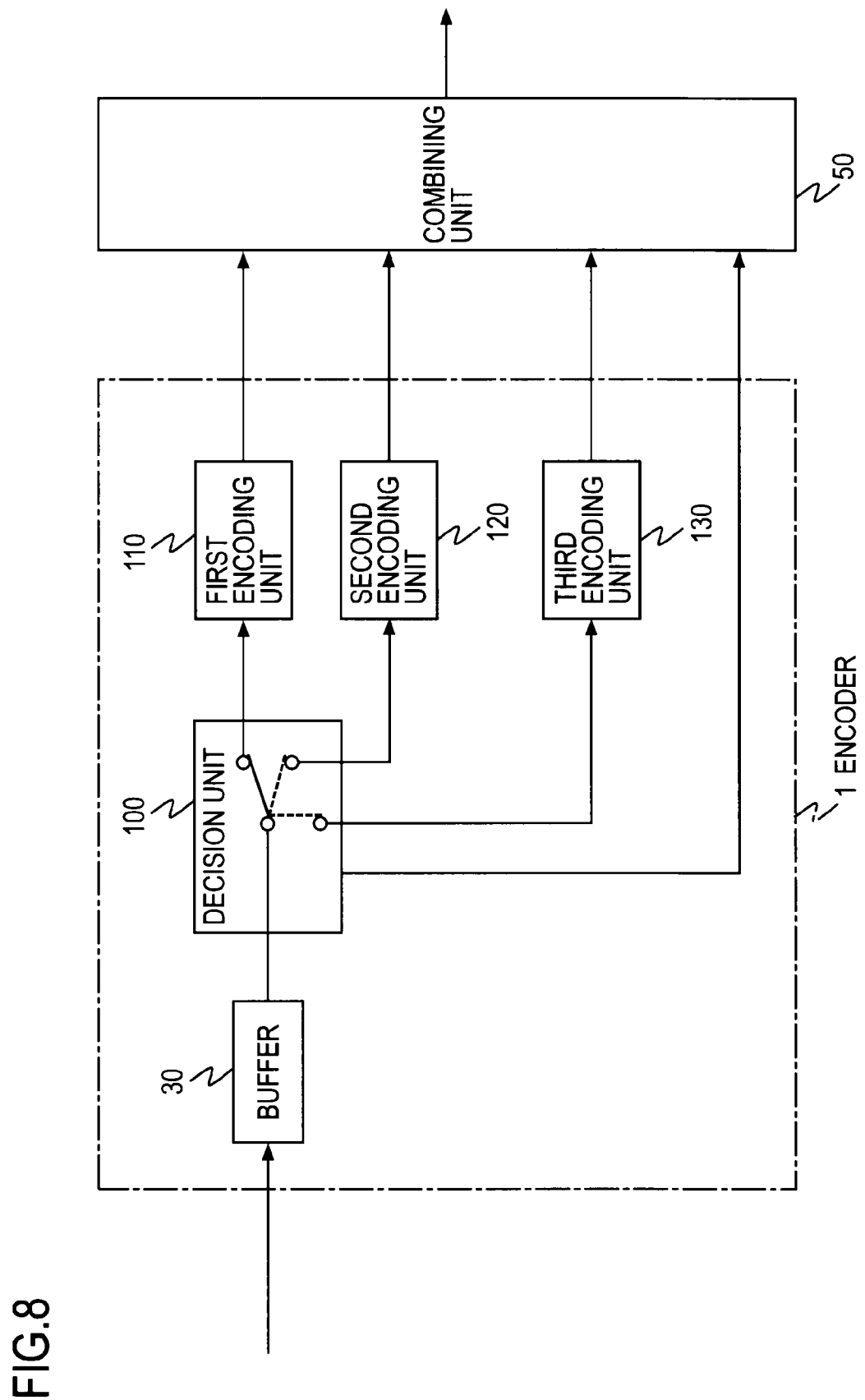
FIG. 8 is a block diagram showing a modification of the example functional configuration of the encoder in the embodiment.

In a modification of the embodiment, a configuration can be adopted as shown in FIG. 8. In that configuration, a third encoding unit 130 is added, and the function of the third encoding unit 130 is implemented by interpreting and executing a program stored in a memory part to process data by a CPU.

Figure 9:
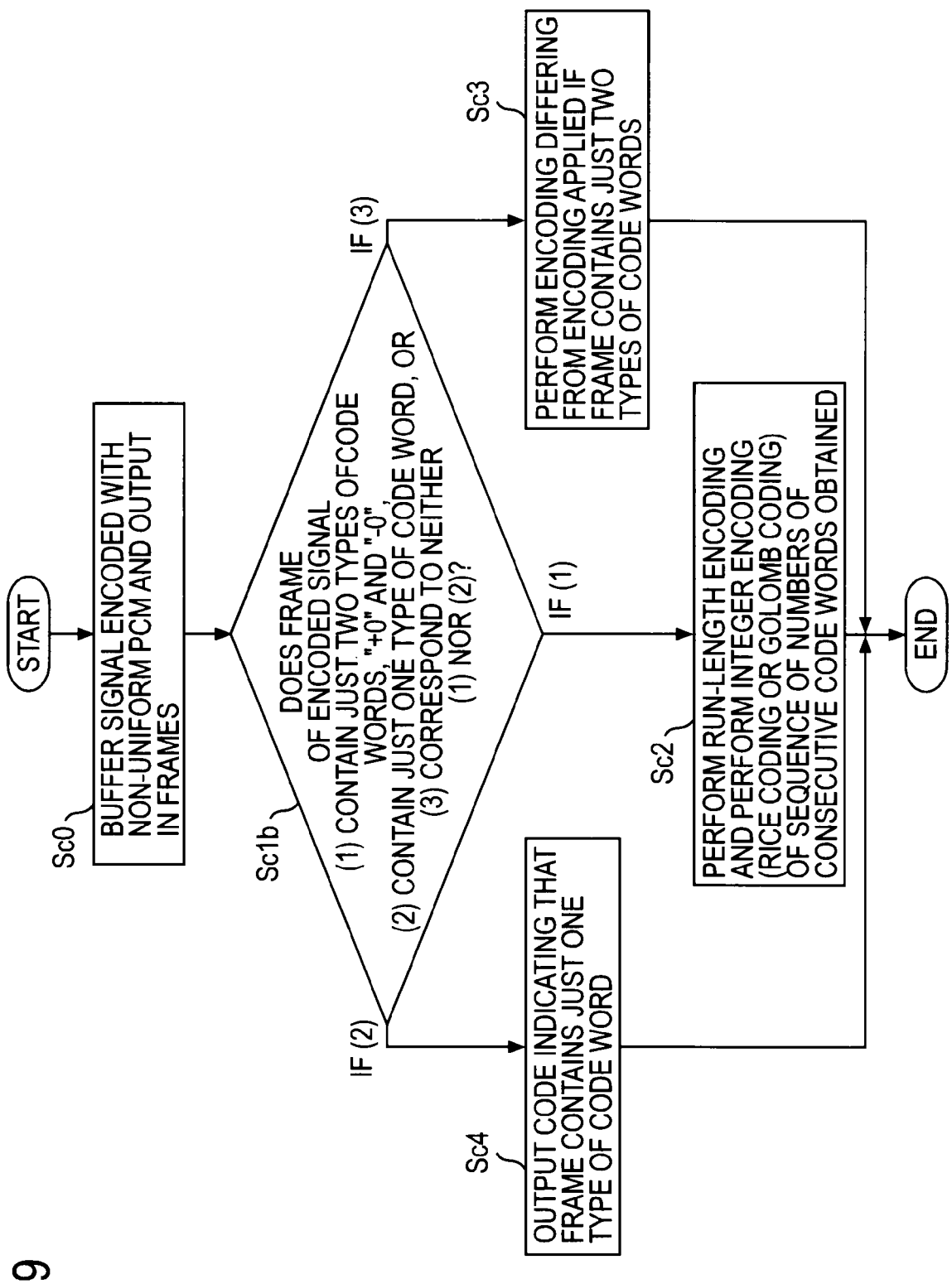
FIG. 9 is a view showing a processing flow of encoding performed by an encoder having the functional configuration shown in FIG. 8.

A decision unit 100 of an encoder 1 checks whether each frame of signals encoded with non-uniform PCM (1) contains two types of code words "+0" and "−0", (2) contains just one type of code word, or (3) corresponds to neither (1) nor (2) (step Sc1b in FIG. 9).

If the code words contained in the frame correspond to (1), the decision unit 100 sends the frame to a first encoding unit 110. If the code words correspond to (3), the decision unit 100 sends the frame to a second encoding unit 120. If the code words correspond to (2), the decision unit 100 sends the frame to the third encoding unit 130.

The processing by the first encoding unit 110 and the processing by the second encoding unit 120 are the same as that described earlier, and a description thereof is omitted.

The third encoding unit 130 of the encoder 1 performs lossless encoding in which a code indicating that the frame contains just one type of code word is output (step Sc4 in FIG. 9). If the frame contains just the code word "+0", a code indicating that the frame contains just the code word "+0" is output. Since it is useless to provide each predetermined code, for each code word, indicating that just the code word is contained, a code indicating that just the code word is contained is predetermined for each of some code words (such as "+0" and "−0"). For the other code words, a code indicating that just one type of code word is contained may be output together with the corresponding code word. For example, if the frame contains just one code word "00011001" and if a code indicating that the frame contains just the code word "00011001" is not predetermined, a code indicating that just one code word is contained is output together with the code word "00011001".

A combining unit 50 multiplexes the code output from the encoder 1, the encoding designation code, and the like. The combining unit 50 outputs a bit stream created by combining the code output from the encoder 1, the encoding designation code, and the like in each frame and connecting the result in the order of frames. If the first encoding unit 110 encodes a frame, the code output by the first encoding unit 110, the code representing the Rice parameter (Golomb parameter), the code indicating the encoding method, and the like, and the encoding designation code output from the decision unit 100 are combined in the frame. If the second encoding unit 120 encodes a frame, the code output by the second encoding unit 120, such as the prediction coefficient code and the residual code, and the encoding designation code output from the decision unit 100 are combined in the frame. If the third encoding unit 130 encodes a frame, the code output by the third encoding unit 130 and the encoding designation code output from the decision unit 100 are combined for the frame. The bit stream is input to a separator 40 shown in FIG. 10. The separator 40 demultiplexes the bit stream to obtain the code and the encoding designation code in each frame output from the encoder 1. These codes are input to a decoder 2.

<Example of Hardware Configuration of Decoder>

The hardware configuration of the decoder 2 is the same as the hardware configuration of the encoder 1 shown in FIG. 1, and a description thereof will be omitted.

An external storage unit of the decoder 2 stores a program for decoding and data required to process the program, and the like (storage is not limited to the external storage unit, and the program may be stored, for example, in a read-only memory, or a ROM). Data obtained by processing the program is stored in a RAM, the external storage unit, or the like, if necessary. The storage units that store programs, data, and the addresses of storage locations, and the like are hereafter collectively called a memory part.

The memory part of the decoder 2 stores a program for determining whether a code contained in an input frame is a code obtained by applying lossless encoding to a frame containing just two types of code words assigned to the two smallest quantization intervals, a program for performing first decoding which decodes the code obtained by lossless encoding, and a program for performing second decoding which decodes codes contained in the input frame if the code has been obtained by encoding, differing from lossless encoding applied to the frame containing just two types of code words, on the frame including a code word other than the two types of code words assigned to the two smallest quantization intervals.

In the decoder 2, each program stored in the memory part and data needed for executing the program are read into the RAM when necessary and the CPU interprets and executes the program to process the data. As a result, desired decoding is implemented when the CPU fulfills given functions (a decision unit, a first decoding unit, and a second decoding unit).

<Decoding>

Figure 10:
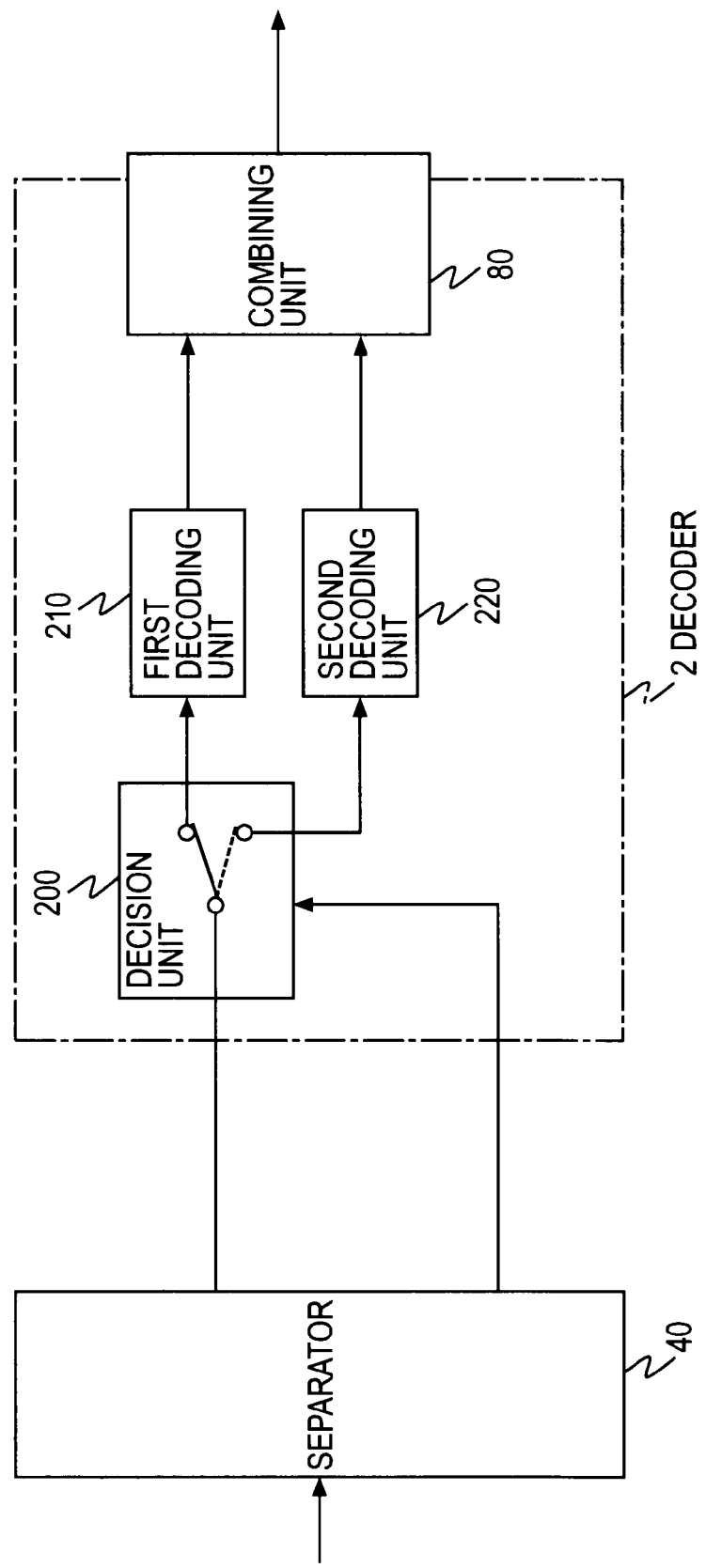
FIG. 10 is a block diagram showing an example functional configuration of a decoder according to an embodiment.
Figure 11:
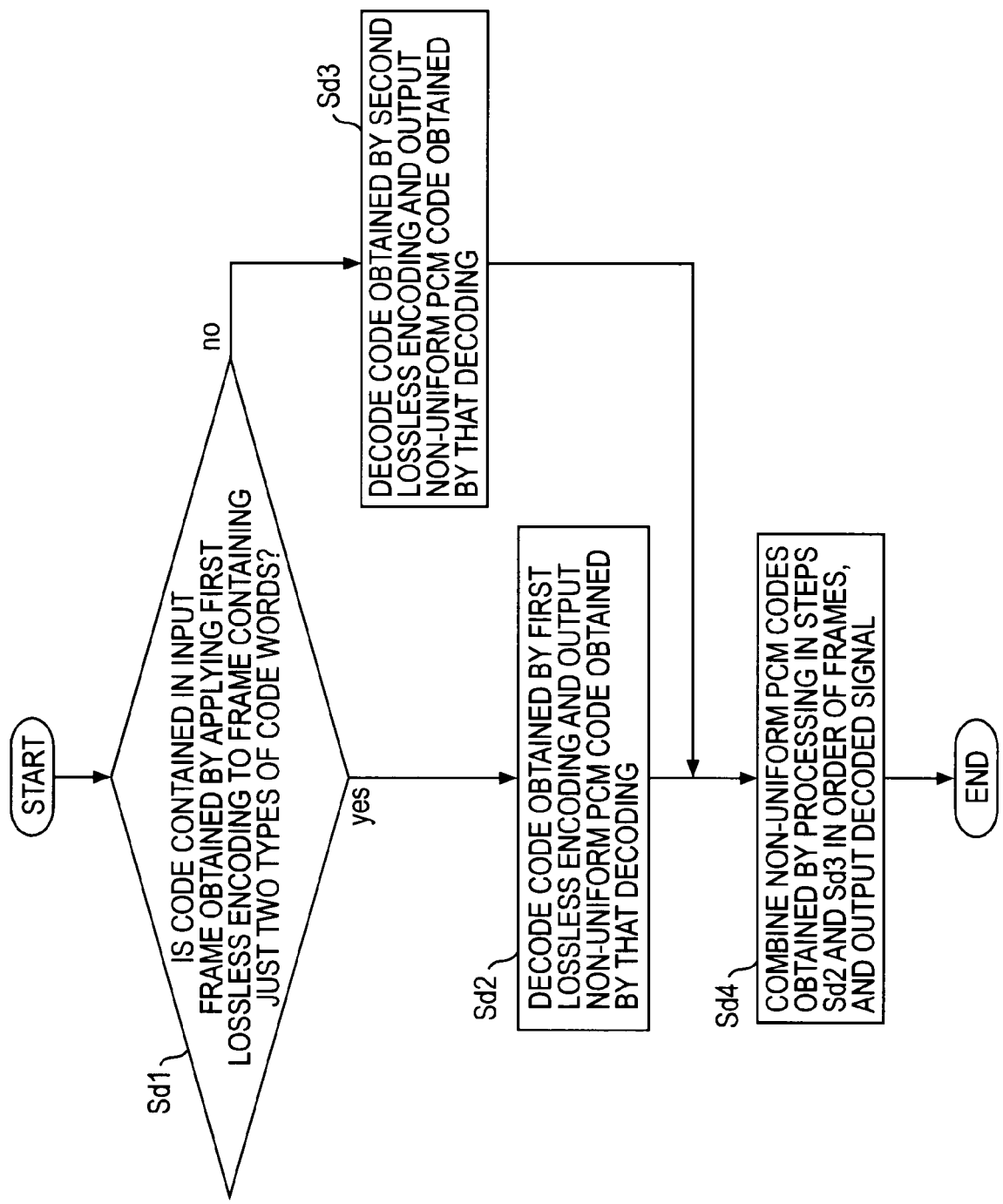
FIG. 11 is a view showing a processing flow of decoding according to the embodiment.
Figure 12:
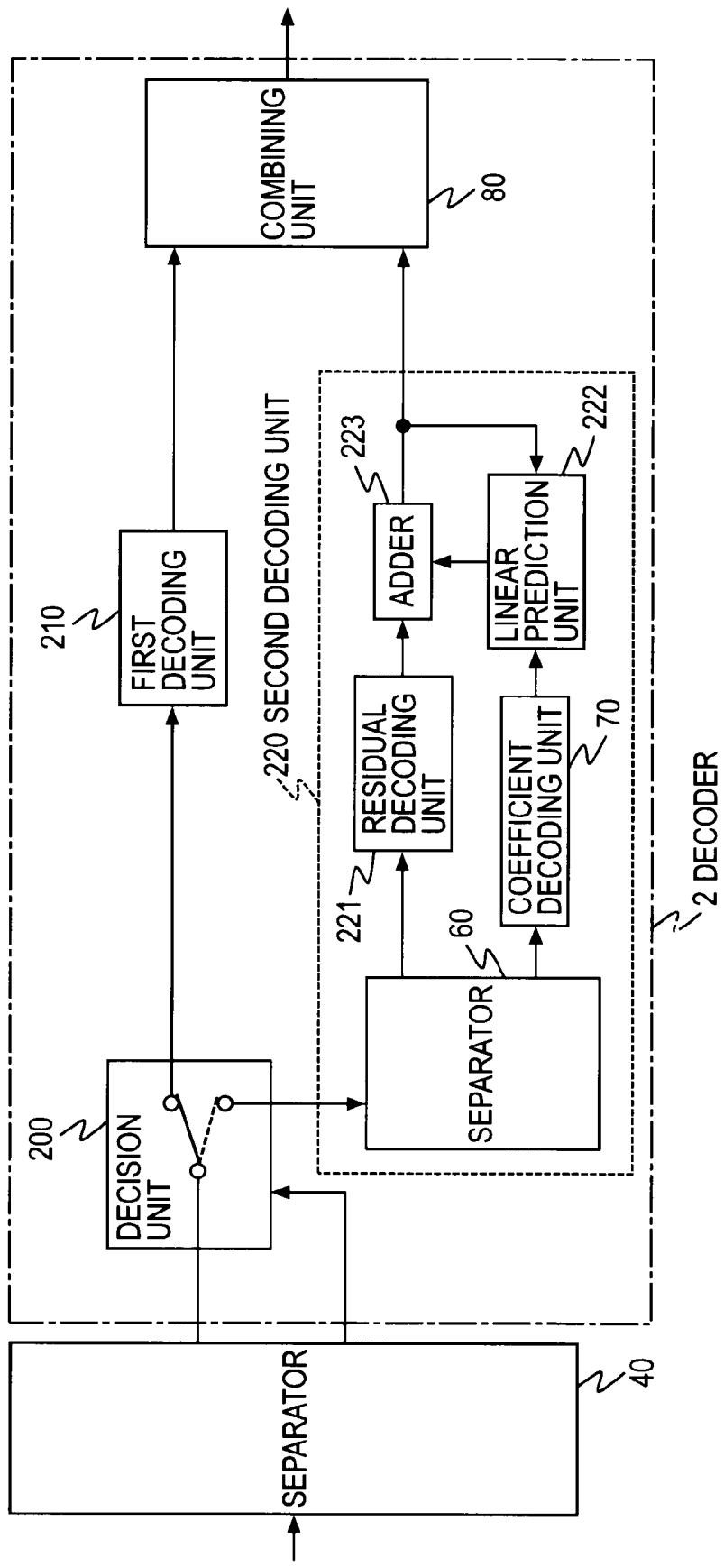
FIG. 12 is a block diagram showing an example functional configuration of a second decoding unit, in the example functional configuration of the decoder in the embodiment.

The flow of decoding in the decoder 2 will be described next with reference to FIGS. 10 to 12.

[Step Sd1]

A decision unit 200 of the decoder 2 decides whether the code contained in the input frame is obtained by lossless encoding of a frame containing just two types of code words "+0" and "−0" assigned to the two smallest quantization intervals. The decision is made based on the input encoding designation code.

If the code contained in the input frame is obtained by lossless encoding of a frame containing just two types of code words "+0" and "−0", that is, if the encoding designation code is a code indicating that first encoding is selected, the decision unit 200 sends the frame to a first decoding unit 210. Otherwise, that is, if the encoding designation code is a code indicating that second encoding is selected, the decision unit 200 sends the frame to a second decoding unit 220.

[Step Sd2]

The first decoding unit 210 of the decoder 2 decodes the code obtained by the first encoding, which is lossless encoding, in the frame sent from the decision unit 200 and outputs a non-uniform PCM codes obtained by this decoding.

Decoding of the code obtained by the first encoding, which is lossless encoding, is achieved as follows. If the first encoding, which is lossless encoding, is two-stage encoding in which run-length encoding is performed and an integer encoding (such as Rice coding and Golomb coding) is performed on a sequence of the numbers of contiguous code words obtained by the run-length encoding, for example, the code contained in the input frame is decoded by using the Rice parameter (Golomb parameter), and a sequence of the numbers of contiguous code words obtained by the decoding is subjected to decoding corresponding to the run-length encoding based on the criterion code word, then the non-uniform PCM codes before encoding by the encoder 1 can be obtained. If the Rice parameter (Golomb parameter) or a criterion code word for run-length encoding is not predetermined by the encoder 1 and decoder 2, the code indicating the Rice parameter (Golomb parameter) and the code indicating the encoding method, obtained by demultiplexing the bit stream sent from the encoder 1, should be followed. Decoding corresponding to Rice coding, Golomb coding, and run-length encoding is described in detail in Reference literature 2, and a description thereof will be omitted here.

If the first encoding, which is lossless encoding, is encoding that encodes the two types of code words to expressions that can be distinguished by a single bit, the sequence of binary bits corresponds directly to the sequence of code words, so that decoding can be performed by replacing the binary bits with the corresponding code words.

If the first encoding, which is lossless encoding, provides a code having a smaller amount of data of the following two codes: a code obtained by encoding that encodes the two types of code words to expressions that can be distinguished by a single bit, and a code obtained by performing run-length encoding and performing an integer encoding of the sequence of the numbers of contiguous code words obtained by run-length encoding, the above-described decoding should be performed in accordance with the code indicating which one of the codes was selected, obtained by demultiplexing the bit stream sent from the encoder 1.

[Step Sd3]

A second decoding unit 220 of the decoder 2 decodes the code obtained by the second encoding, which is lossless encoding, and outputs non-uniform PCM codes obtained by decoding. Details of decoding depend on the type of the second encoding, which is lossless encoding.

Described below is decoding performed by the second decoding unit 220 (see FIG. 12), corresponding to the second encoding, which is lossless encoding, in which the non-uniform PCM codes are converted to uniform PCM codes, linear prediction analysis of the uniform PCM codes are performed, a prediction value obtained by using the resultant prediction coefficients is converted to non-uniform PCM codes, and the respective residuals between the original non-uniform PCM codes and the non-uniform PCM codes of the prediction value are encoded.

A separator 60 demultiplexes a frame sent from the decision unit 200 and obtains the residual code and the prediction coefficient code included in the frame. A coefficient decoding unit 70 decodes the prediction coefficient code output from the separator 60 to output the prediction coefficients. A residual decoding unit 221 of the second decoding unit 220 decodes the residual code output from the separator 60 to output the residuals. An adder 223 adds respective prediction values output from a linear prediction unit 222 to the respective residuals to output the results as non-uniform PCM codes. The linear prediction unit 222 outputs the prediction value through linear prediction, based on the prediction coefficients output from the coefficient decoding unit 70 and the non-uniform PCM codes output from the adder 223. A configuration in which the separator 60 is not an indispensable element in the second decoding unit 220 is also permitted. In that case, the separator 60 becomes an element of the decoder 2, disposed between the decision unit 200 and the second decoding unit 220.

[Step Sd4]

A combining unit 80 of the decoder 2 combines the non-uniform PCM codes output from the first decoding unit 210 and the non-uniform PCM codes output from the second decoding unit 220 in the order of frames and outputs decoded signals. The decoded signals correspond to the signals encoded with non-uniform PCM, input to the buffer 30 of the encoder 1.

In a modification of the embodiment described above, decoding can be adopted as shown in FIG. 13. This decoding is performed if the first encoding unit 110 of the encoder 1 is configured to output a code having a smaller amount of data of the following two codes: a code obtained by encoding that encodes the two types of code words of non-uniform PCM to expressions that can be distinguished by a single bit, and a code obtained by an integer encoding (Rice coding, Golomb coding, or the like) on a sequence of the numbers of contiguous code words obtained by run-length encoding.

Figure 13:
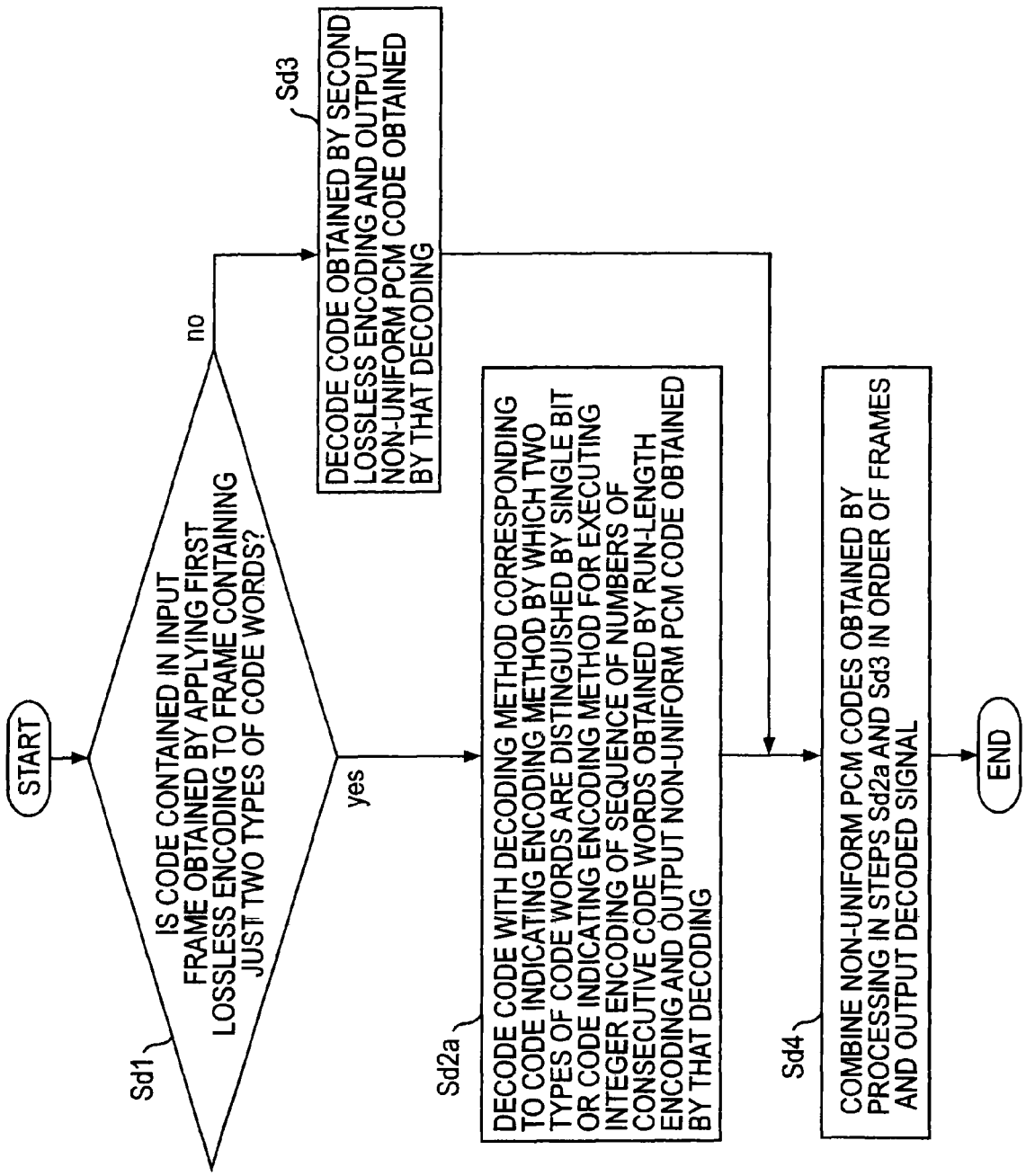
FIG. 13 is a view showing a processing flow of a modification of the decoding in the embodiment.

In this decoding, the first decoding unit 210 decodes the code in the frame sent from the decision unit 200, with a decoding method corresponding to a code indicating a binary encoding method that encodes two types of non-uniform PCM code words to expressions that can be distinguished by a single bit, or with a decoding method corresponding to a code indicating a two-stage encoding method in which a sequence of the numbers of contiguous code words obtained in run-length encoding is subjected to an integer encoding, and outputs the non-uniform PCM codes obtained by decoding (step Sd2a in FIG. 13).

Figure 14:
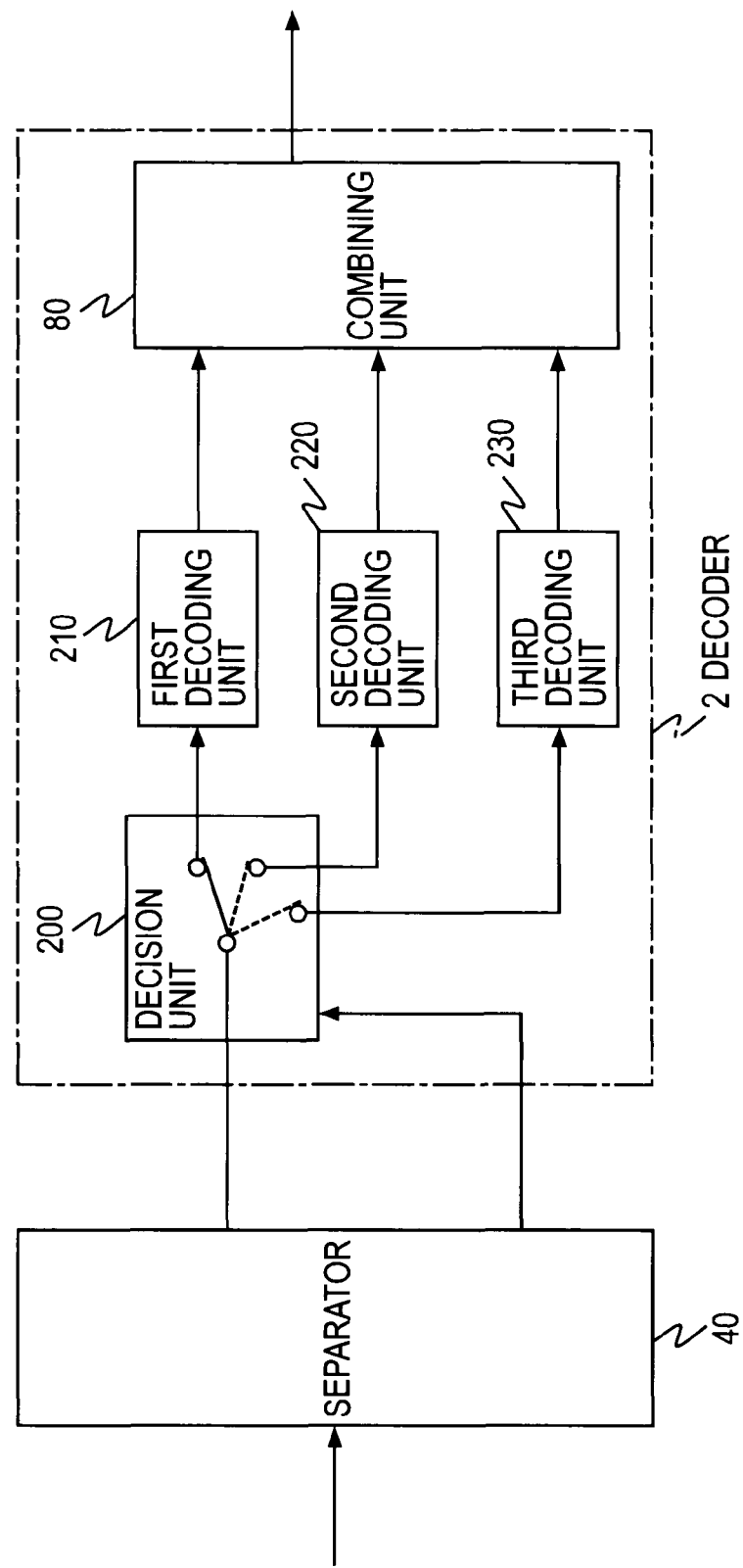
FIG. 14 is a block diagram showing a modification of the example functional configuration of the decoder in the embodiment.

In a modification of the embodiment described above, a configuration can be adopted as shown in FIG. 14. This configuration corresponds to the encoder 1 that includes the third encoding unit 130, and a third decoding unit 230 is added to the decoder 2. The function of the third decoding unit 230 is implemented when the CPU interprets and executes the program stored in the memory part to process data.

Figure 15:
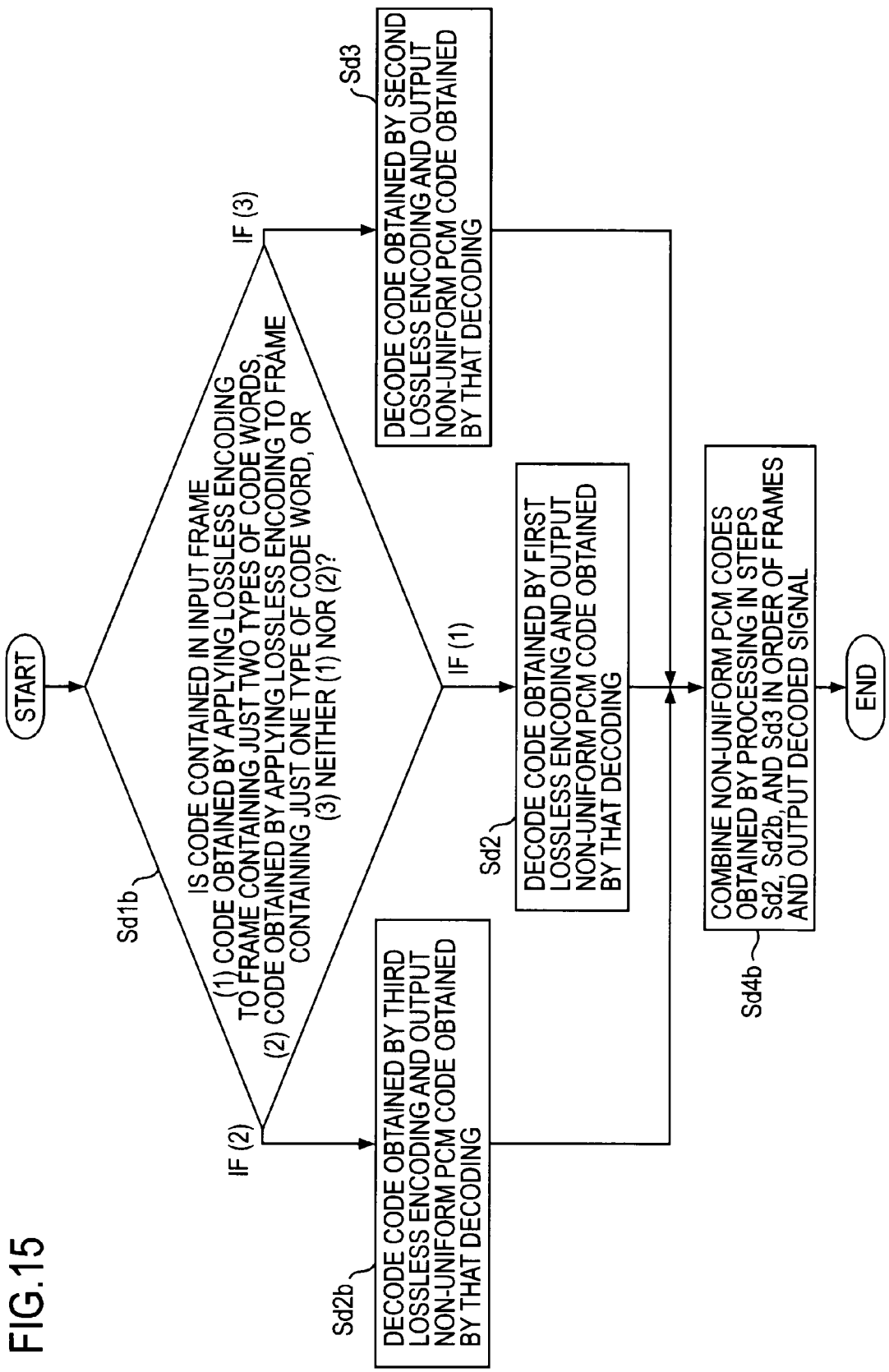
FIG. 15 is a view showing a processing flow of decoding performed by a decoder having the functional configuration shown in FIG. 14.

The decision unit 200 of the decoder 2 decides whether the code contained in the input frame is (1) a code obtained by applying lossless encoding to a frame containing just two types of code words "+0" and "−0" assigned to the two smallest quantization intervals, (2) a code obtained by applying lossless encoding to a frame containing just one type of code word, or (3) neither (1) nor (2) (step Sd1b in FIG. 15). The decision is made based on the input encoding designation code.

If the code contained in the input frame corresponds to (1), the decision unit 200 sends the frame to the first decoding unit 210. If the code corresponds to (3), the decision unit 200 sends the frame to the second decoding unit 220. If the code corresponds to (2), the decision unit 200 sends the frame to the third decoding unit 230.

Processing in the first decoding unit 210 and processing in the second decoding unit 220 are the same as described earlier, and a description thereof will be omitted.

The third decoding unit 230 decodes the code obtained with the third encoding, which is lossless encoding, (the code obtained by applying lossless encoding to a frame containing just one type of code word) of a frame output from the decision unit 200 in accordance with the encoding designation code, and outputs a non-uniform PCM codes obtained by that decoding (step Sd2b in FIG. 15). A combining unit 80 of the decoder 2 combines the non-uniform PCM codes output from the first decoding unit 210, the non-uniform PCM codes output from the second decoding unit 220, and the non-uniform PCM codes output from the third decoding unit 230 in order of frames and outputs decoded signals (step Sd4b in FIG. 15).

The encoder, the encoding method, the decoder, and the decoding method according to the present invention are not limited to the embodiments described above, and modifications can be made without departing from the scope of the present invention. For example, the non-linear quantization mode may be the A law, and in that case, the code words "+0" and "−0" in the embodiments should be read as "+8" and "−8". The technological features appearing in the description given above can be combined freely so long as they are not incompatible with one another.

When the processing functions of the encoder and decoder are implemented by a computer, processing details of the functions that should be provided by the encoder and decoder are described in a program. When the program is executed by a computer, the processing functions of the encoder and decoder are implemented on the computer.

The program containing the processing details can be recorded in a computer-readable recording medium. The computer-readable recording medium can be any type of medium, such as a magnetic recording device, an optical disc, a magneto-optical recording medium, and a semiconductor memory. For example, a hard disk device, a flexible disk, a magnetic tape, or the like can be used as a magnetic recording device; a digital versatile disc (DVD), a DVD random access memory (DVD-RAM), a compact disc read only memory (CD-ROM), a CD recordable or rewritable (CD-R/RW), or the like can be used as an optical disc; a magneto-optical disc or the like can be used as a magneto-optical recording medium; and an electronically erasable and programmable read only memory (EEPROM) or the like can be used as a semiconductor memory.

The program is distributed by selling, transferring, or lending a portable recording medium such as a DVD or a CD-ROM with the program recorded on it, for example. The program may also be distributed by storing the program in a storage unit of a server computer and transferring the program from the server computer to another computer through the network.

A computer that executes this type of program first stores the program recorded on the portable recording medium or the program transferred from the server computer in its storage unit. Then, the computer reads the program stored in its recording medium and executes processing in accordance with the read program. In a different program execution form, the computer may read the program directly from the portable recording medium and execute processing in accordance with the program, or the computer may execute processing in accordance with the program each time the computer receives the program transferred from the server computer. Alternatively, the processing may be executed by a so-called application service provider (ASP) service, in which the processing function is implemented just by giving a program execution instruction and obtaining the results without transferring the program from the server computer to the computer. The program described above includes information that is provided for use in processing by a computer and is treated correspondingly as a program (something that is not a direct instruction to the computer but is data or the like that has characteristics that determine the processing executed by the computer).

In the description given above, the encoder and decoder are implemented by executing a predetermined program on the computer, but at least a part of the processing may be implemented by hardware.

DESCRIPTION OF REFERENCE NUMERALS

1 Encoder
2 Decoder
100 Decision unit
110 First encoding unit
120 Second encoding unit
130 Third encoding unit
200 Decision unit
210 First decoding unit
220 Second decoding unit
230 Third decoding unit

What is claimed is:

1. An encoding method comprising:
 a decision step of accepting input code words encoded with an encoding mode in which two different types of code words are assigned one-to-one to two smallest quantization intervals, and judging whether a frame formed of a plurality of the code words contains just the two types of code words assigned to the two smallest quantization intervals;
 a first encoding step of outputting a code obtained by lossless encoding of the frame containing just the two types of code words when it is judged that the frame contains just the two types of code words; and
 a second encoding step of performing encoding differing from the encoding in the first encoding step on a frame that includes a code word other than the two types of code words,
 wherein the encoding mode is non-uniform PCM (pulse code modulation); and
 the second encoding step comprises a step of converting first non-uniform PCM codes of signals formed of code words encoded with the non-uniform PCM, to uniform PCM codes, converting prediction values obtained by using prediction coefficients obtained by applying linear prediction analysis to the uniform PCM codes, to second non-uniform PCM codes, and encoding respective residuals between the first non-uniform PCM codes and the second non-uniform PCM codes.

2. The encoding method according to claim 1 wherein the first encoding step comprises a step of performing lossless encoding of a sequence of numbers of contiguous code words of either one of the two types of code words contained in the frame.

3. The encoding method according to claim 2, wherein if a total number of times one of the two types of code words occurs in the frame is greater than a total number of times the other of the two types of code words occurs in the frame, the sequence of the numbers of contiguous code words is a sequence of numbers of contiguous code words of the one of the two types of code words for which the total number of occurrences is greater.

4. The encoding method according to claim 1, wherein the lossless encoding in the first encoding step is encoding that encodes the two types of code words to expressions that are distinguished by a single bit.

5. The encoding method according to claim 2, wherein the first encoding step comprises a step of outputting a code having a smaller amount of data of the following two codes: a code obtained by encoding that encodes the two types of code words to expressions that are distinguished by a single bit, and a code obtained by lossless encoding of the sequence of the numbers of contiguous code words of either one of the two types of code words.

6. The encoding method according to claim 2 or 5, wherein the lossless encoding is Rice coding or Golomb coding.

7. The encoding method according to claim 2, wherein the encoding mode is non-uniform PCM stipulated in international standard G. 711; and the two types of code words assigned to the two smallest quantization intervals are code words assigned to smallest quantization intervals of μ-law or A-law stipulated in international standard G. 711.

8. An encoder comprising:
a decision unit for accepting input code words encoded with an encoding mode in which two different types of code words are assigned one-to-one to two smallest quantization intervals, and judging whether a frame formed of a plurality of the code words contains just the two types of code words assigned to the two smallest quantization intervals; and
a first encoding unit for outputting a code obtained by lossless encoding of the frame containing just the two types of code words when it is judged that the frame contains just the two types of code words; and
a second encoding unit for performing encoding differing from the encoding in the first encoding unit on a frame that includes a code word other than the two types of code words,
wherein the encoding mode is non-uniform PCM (pulse code modulation); and
the second encoding step comprises a step of converting first non-uniform PCM codes of signals formed of code words encoded with the non-uniform PCM, to uniform PCM codes, converting prediction values obtained by using prediction coefficients obtained by applying linear prediction analysis to the uniform PCM codes, to second non-uniform PCM codes, and encoding respective residuals between the first non-uniform PCM codes and the second non-uniform PCM codes.

9. A decoding method comprising a step of accepting an input code obtained by lossless encoding of a frame containing just two types of code words assigned to two smallest quantization intervals, among frames formed of a plurality of code words encoded with an encoding mode in which two different types of code words are assigned one-to-one to two the smallest quantization intervals, and outputting signals obtained by decoding the code, wherein
the lossless encoding is performed on a sequence of numbers of contiguous code words of either one of the two types of code words contained in the frame; and
if a total number of times one of the two types of code words occurs in the frame is greater than a total number of times the other of the two types of code words occurs in the frame, the sequence of the numbers of contiguous code words is a sequence of numbers of contiguous code words of the one of the two types of code words for which the total number of occurrences is greater.

10. A decoding method comprising:
a decision step of judging whether an input code has been lossless-encoded with a first encoding mode or encoded with a second encoding mode differing from the first encoding mode, the input code being of each frame among frames formed of a plurality of code words encoded with an encoding mode in which two different types of code words are assigned one-to-one to two smallest quantization intervals, the input code of each frame containing just the two types of code words assigned to the two smallest quantization intervals having been lossless-encoded with the first encoding mode, and the input code of each frame including a code word other than the two types of code words assigned to the two smallest quantization intervals having been encoded with the second encoding mode;
a first decoding step of decoding the input code judged to have been lossless-encoded with the first encoding mode; and
a second decoding step of decoding the input code judged to have been encoded with the second encoding mode with a mode differing from the mode used in the first decoding step,
wherein the encoding mode is non-uniform PCM (pulse code modulation); and
the second encoding mode comprises a step of converting first non-uniform PCM codes of signals formed of code words encoded with the non-uniform PCM, to uniform PCM codes, converting prediction values obtained by using prediction coefficients obtained by applying linear prediction analysis to the uniform PCM codes, to second non-uniform PCM codes, and encoding respective residuals between the first non-uniform PCM codes and the second non-uniform PCM codes.

11. A decoder comprising:
a decoding unit for accepting an input code obtained by lossless encoding of a frame containing just two types of code words assigned to two smallest quantization intervals, among frames formed of a plurality of code words encoded with an encoding mode in which two different types of code words are assigned one-to-one to the two smallest quantization intervals, and outputting signals obtained by decoding the code,
wherein the lossless encoding is performed on a sequence of numbers of contiguous code words of either one of the two types of code words contained in the frame; and
if a total number of times one of the two types of code words occurs in the frame is greater than a total number of times the other of the two types of code words occurs in the frame, the sequence of the numbers of contiguous code words is a sequence of numbers of contiguous code words of the one of the two types of code words for which the total number of occurrences is greater.

12. A decoder comprising:
a decision unit for judging whether an input code has been lossless-encoded with a first encoding mode or encoded with a second encoding mode differing from the first encoding mode, the input code being of each frame among frames formed of a plurality of code words encoded with an encoding mode in which two different types of code words are assigned one-to-one to two smallest quantization intervals, the input code of each frame containing just the two types of code words assigned to the two smallest quantization intervals having been lossless-encoded with the first encoding mode, and the input code of each frame including a code word other than the two types of code words assigned to the two smallest quantization intervals having been encoded with the second encoding mode;
a first decoding unit for decoding the input code judged to have been lossless-encoded with the first encoding mode; and
a second decoding unit for decoding the input code judged to have been encoded with the second encoding mode with a mode differing from the mode used in the first decoding unit,
wherein the encoding mode is non-uniform PCM (pulse code modulation); and
the second encoding mode comprises a step of converting first non-uniform PCM codes of signals formed of code words encoded with the non-uniform PCM, to uniform PCM codes, converting prediction values obtained by using prediction coefficients obtained by applying linear prediction analysis to the uniform PCM codes, to second non-uniform PCM codes, and encoding respective residuals between the first non-uniform PCM codes and the second non-uniform PCM codes.

13. An encoding method comprising:
a decision step of accepting input code words encoded with an encoding mode in which two different types of code words are assigned one-to-one to two smallest quantization intervals, and judging whether a frame formed of a plurality of the code words contains just the two types of code words assigned to the two smallest quantization intervals; and
a first encoding step of outputting a code obtained by lossless encoding of the frame containing just the two types of code words when it is judged that the frame contains just the two types of code words,
wherein the first encoding step comprises a step of performing lossless encoding of a sequence of numbers of contiguous code words of either one of the two types of code words contained in the frame; and
if a total number of times one of the two types of code words occurs in the frame is greater than a total number of times the other of the two types of code words occurs in the frame, the sequence of the numbers of contiguous code words is a sequence of numbers of contiguous code words of the one of the two types of code words for which the total number of occurrences is greater.

14. The encoding method according to claim 13, wherein the first encoding step includes outputting a code that indicates a lossless encoding mode, the lossless encoding mode using the one of the two types of code words as a criterion code word for the lossless encoding of the sequence of numbers of the contiguous code words.

15. An encoder comprising:
a decision unit for accepting input code words encoded with an encoding mode in which two different types of code words are assigned one-to-one to two smallest quantization intervals, and judging whether a frame formed of a plurality of the code words contains just the two types of code words assigned to the two smallest quantization intervals; and
a first encoding unit for outputting a code obtained by lossless encoding of the frame containing just the two types of code words when it is judged that the frame contains just the two types of code words,
wherein the first encoding unit performs lossless encoding of a sequence of numbers of contiguous code words of either one of the two types of code words contained in the frame; and
if a total number of times one of the two types of code words occurs in the frame is greater than a total number of times the other of the two types of code words occurs in the frame, the sequence of the numbers of contiguous code words is a sequence of numbers of contiguous code words of the one of the two types of code words for which the total number of occurrences is greater.

16. A decoding method comprising a step of accepting a first input code obtained by lossless encoding of a frame containing just two types of code words assigned to two smallest quantization intervals, among frames formed of a plurality of code words encoded with an encoding mode in which two different types of code words are assigned one-to-one to the two smallest quantization intervals, and a second input code indicating a mode of the lossless encoding, and outputting signals obtained by decoding of the first input code, wherein
the mode of the lossless encoding corresponds to one of the two types of code words as a criterion code word for the lossless encoding, and
the decoding of the first input code includes lossless decoding of a sequence of numbers of contiguous code words of the criterion code word.

17. A non-transitory computer-readable recording medium on which an encoding program making a computer execute the steps of the encoding method according to claim 1 or 13 has been recorded.

18. A non-transitory computer-readable recording medium on which a decoding program making a computer execute each step of the decoding method according to claim 9 or 10 has been recorded.

* * * * *